(12) United States Patent
Yamamoto et al.

(10) Patent No.: US 10,845,421 B2
(45) Date of Patent: Nov. 24, 2020

(54) STORAGE BATTERY EVALUATION DEVICE, ENERGY STORAGE SYSTEM, AND STORAGE BATTERY EVALUATION METHOD

(71) Applicant: KABUSHIKI KAISHA TOSHIBA, Minato-ku (JP)

(72) Inventors: Takahiro Yamamoto, Fuchu (JP); Takenori Kobayashi, Meguro (JP); Masatake Sakuma, Kiyose (JP); Ryosuke Takeuchi, Shinagawa (JP); Takahisa Wada, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 338 days.

(21) Appl. No.: 15/907,737

(22) Filed: Feb. 28, 2018

(65) Prior Publication Data

US 2018/0188330 A1 Jul. 5, 2018

Related U.S. Application Data

(63) Continuation of application No. PCT/JP2016/058042, filed on Mar. 14, 2016.

(51) Int. Cl.
*G01R 31/36* (2020.01)
*G01R 31/392* (2019.01)
(Continued)

(52) U.S. Cl.
CPC ......... *G01R 31/392* (2019.01); *G01R 31/386* (2019.01); *G01R 31/389* (2019.01);
(Continued)

(58) Field of Classification Search
None
See application file for complete search history.

(56) References Cited

U.S. PATENT DOCUMENTS

2011/0187329 A1 8/2011 Majima et al.
2013/0187466 A1* 7/2013 Sakai ................ H01M 10/42
 307/52
(Continued)

FOREIGN PATENT DOCUMENTS

JP 11-326471 11/1999
JP 2004-180428 6/2004
(Continued)

OTHER PUBLICATIONS

International Search Report dated Apr. 12, 2016 in PCT/JP2016/058042 filed Mar. 14, 2016.

*Primary Examiner* — Jas A Sanghera
(74) *Attorney, Agent, or Firm* — Oblon, McClelland, Maier & Neustadt, L.L.P.

(57) ABSTRACT

According to one embodiment, a storage battery evaluation device includes a charging/discharging controller and a deterioration evaluator. The charging/discharging controller acquires a charging/discharging power command value, performs control to charge and discharge an energy storage device according to the charging/discharging power command value, sets a dead zone in which the charging and discharging is not performed when an absolute value of the charging/discharging power command value is equal to or smaller than a threshold, and performs control to stop the charging and discharging when the charging/discharging command value enters the dead zone. The deterioration evaluator measures a response characteristic of a voltage of the energy storage device at a time when the charging and discharging is stopped from a state in which the energy storage device is charged and discharged and evaluates a deterioration state of the energy storage device on a basis of the response characteristic.

11 Claims, 19 Drawing Sheets

(51) Int. Cl.
  *G01R 31/385* (2019.01)
  *G01R 31/3842* (2019.01)
  *G01R 31/389* (2019.01)
  *H01M 10/48* (2006.01)
  *G01R 31/396* (2019.01)

(52) U.S. Cl.
  CPC ...... *G01R 31/3842* (2019.01); *H01M 10/482* (2013.01); *G01R 31/396* (2019.01); *H01M 2220/20* (2013.01)

(56) References Cited

U.S. PATENT DOCUMENTS

| | | |
|---|---|---|
| 2015/0349547 A1* | 12/2015 | Jeon ................ H02J 7/0016 320/134 |
| 2016/0116547 A1 | 4/2016 | Hanyu et al. |
| 2017/0031404 A1 | 2/2017 | Yamamoto et al. |
| 2017/0139014 A1 | 5/2017 | Yamamoto et al. |

FOREIGN PATENT DOCUMENTS

| | | |
|---|---|---|
| JP | 2011-238526 | 11/2011 |
| JP | 2014-153131 | 8/2014 |
| JP | 2015-031674 | 2/2015 |
| JP | 2016-085166 | 5/2016 |
| WO | WO 2010/029942 A1 | 3/2010 |
| WO | WO 2012/023215 A1 | 2/2012 |
| WO | WO2016/135913 | 9/2016 |
| WO | WO2017/022037 | 2/2017 |

* cited by examiner

ELAPSED TIME

ELAPSED TIME

STORAGE BATTERY EVALUATION DEVICE, ENERGY STORAGE SYSTEM, AND STORAGE BATTERY EVALUATION METHOD

CROSS-REFERENCE TO RELATED APPLICATIONS

The present application is a Continuation of International Application No. PCT/JP2016/058042, filed on Mar. 14, 2016, the entire contents of which is hereby incorporated by reference.

FIELD

Embodiments described herein relates to a storage battery evaluation device, an energy storage system, and a storage battery evaluation method.

BACKGROUND

An energy storage system (ESS) includes a charging/discharging function. The energy storage system is used for improvement of power quality such as stabilization of electric power supplied by a power system and suppression of frequency fluctuation in the power system. The energy storage system is also used for a reduction of peak consumption of a consumer. Expansion of the market of such an energy storage system in future is expected.

For power quality improvement applications of a system, the energy storage system is basically operated 24 hours/365 days. Therefore, when deterioration evaluation of the energy storage system is performed, it is desired to perform the deterioration evaluation without stopping the function of the energy storage system. The mainstream in the present situation is to perform deterioration estimation on the basis of a charging/discharging history. However, state evaluation in operation for a long period of twenty years has not been realized yet. There is a method of performing deterioration estimation through monitoring and remote monitoring of the energy storage system. However, this method has not been realized yet either. In energy storage systems for a vehicle-mounted use and a low-level power distribution side use, the energy storage system in operation can be stopped. Therefore, precise deterioration evaluation can be performed by stopping the energy storage system and actually performing a charging/discharging test. However, in the energy storage system for the use of power quality improvement in a power system, the energy storage system in operation cannot be stopped. Therefore, this method is unrealistic.

DETAILED DESCRIPTION

According to one embodiment, a storage battery evaluation device includes a charging/discharging controller and a deterioration evaluator. The charging/discharging controller acquires a charging/discharging power command value, performs control to charge and discharge an energy storage device according to the charging/discharging power command value, sets a dead zone in which the charging and discharging is not performed when an absolute value of the charging/discharging power command value is equal to or smaller than a threshold, and performs control to stop the charging and discharging when the charging/discharging command value enters the dead zone. The deterioration evaluator measures a response characteristic of a voltage of the energy storage device at a time when the charging and discharging is stopped from a state in which the energy storage device is charged and discharged and evaluates a deterioration state of the energy storage device on a basis of the response characteristic.

An embodiment of the present invention is explained below with reference to the drawings.

Figure 1:
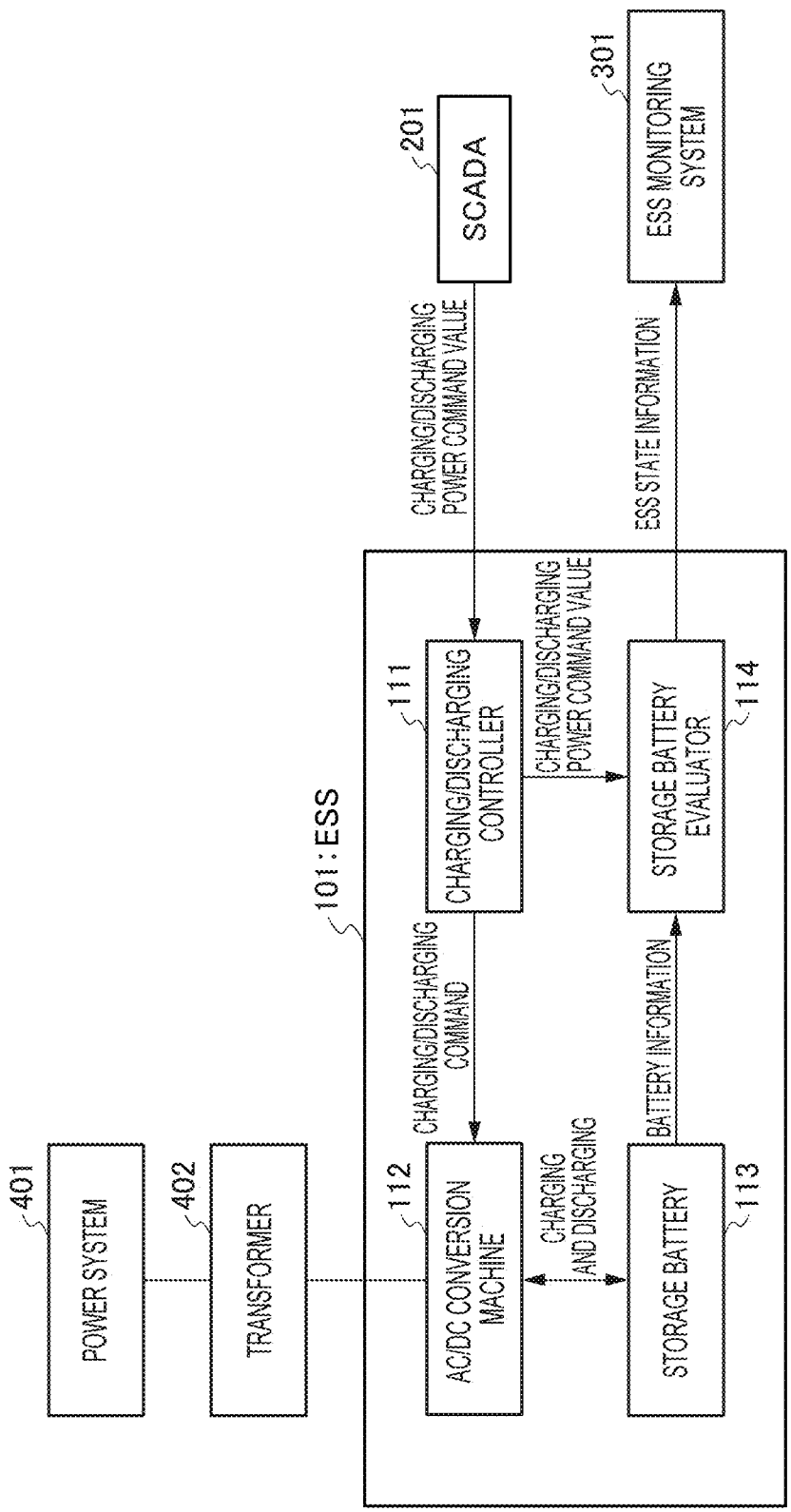
FIG. 1 is a diagram showing an energy storage system according to an embodiment of the present invention.

In FIG. 1, an energy storage system (ESS) 101 according to the embodiment of the present invention is shown. The energy storage system 101 includes a charging/discharging controller 111, an AC/DC conversion machine 112, a storage battery 113, and a state evaluator 114, which is a storage battery evaluation device. The energy storage system 101 has a function of performing charging and discharging to and from a power system according to a charging/discharging power command value (a power command value) from a SCADA 201. The energy storage system 101 has a function of performing deterioration evaluation of the storage battery 113 and notifying ESS state information representing a state of the storage battery 113 to an ESS monitoring system 301. The energy storage system 101 is explained more in detail below.

The energy storage system 101 is connected to a power system 401 via a transformer 402. The transformer 402 converts a voltage of electric power transmitted from the power system 401. The electric power after the conversion is supplied to the energy storage system 101. The transformer 402 converts electric power discharged from the energy storage system 101 into a voltage for the system 401 and supplies electric power after the conversion to the system 401.

The energy storage system 101 is connected to the SCADA 201 via a communication network. The SCADA (Supervisory Control And Data Acquisition) 201 regards various energy storage systems (ESSs) 101 present in a region as one large ESS and transmits charging/discharging power command values (power command values) for indicating charging/discharging electric power according to times to the individual ESSs. Consequently, charging and discharging of the individual ESSs to and from the power system 401 is controlled. The charging/discharging power command value includes both of a command value for charging and a command value for discharging or at least one of the command values. The energy storage system 101 in FIG. 1 is equivalent to one of the various ESSs present in the region. The SCADA 201 performs control of the charging and discharging of the individual ESSs on the basis of a command from a high-order energy management system such as a central load dispatching and liaison office of a power company, a command from individual energy management systems on a low-level power distribution side, both of the commands, or the like.

The energy storage system 101 is connected to an ESS monitoring system 301 via a communication network. The ESS monitoring system 301 monitors the energy storage system 101 on the basis of ESS state information provided from the energy storage system 101. The ESS monitoring system 301 includes a monitor, generates screen data on the basis of monitoring, and displays a screen on the monitor. An observer refers to the screen displayed on the monitor to grasp a state of the ESS. The ESS monitoring system 301 may control the operation of the ESS according to a monitoring result of the ESS or a command of the observer.

The communication network that connects the energy storage system 101 and the ESS monitoring system 301 and the communication network that connects the SCADA 201 and the energy storage system 101 may be the same as or may be different from each other. The communication network may be a wireless network, a wired network, or a mixture of the wireless network and the wired network. A communication protocol may be a protocol originally decided for the SCADA 201 or the ESS or may be a general-purpose protocol or a protocol based on the general-purpose protocol.

The charging/discharging controller 111 of the energy storage system 101 receives a charging/discharging power command value from the SCADA 201. The charging/discharging controller 111 includes a receiver that receives the charging/discharging power command value. The charging/discharging controller 111 generates, on the basis of the charging/discharging power command value, a command for charging or discharging (a charging/discharging command) that the AC/DC conversion machine 112 can interpret. The charging/discharging controller 111 sends the generated charging/discharging command to the AC/DC conversion machine 112. When the AC/DC conversion machine 112 can interpret the charging/discharging power command value as it is, the charging/discharging controller 111 may send the charging/discharging power command value as it is. The charging/discharging controller 111 sends the received charging/discharging power command value to the state evaluator 114. At this time, the charging/discharging controller 111 may convert the charging/discharging power command value into a format interpretable by the state evaluator 114 and send the charging/discharging power command value.

The charging/discharging controller 111 sets an output dead zone (hereinafter, dead zone) in which charging and discharging is not performed when the absolute value of the charging/discharging power command value is equal to or smaller than a threshold and inspects whether the charging/discharging power command value is included in the dead zone. Charging may be performed when the charging/discharging power command value is positive and discharging may be performed when the charging/discharging power command value is negative or vice versa. In this embodiment, a command value indicating that charging and discharging is not performed is represented by zero. When the charging/discharging power command value is not included in the dead zone, as explained above, the charging/discharging controller 111 outputs the charging/discharging power command value received from the SCADA 201 or a charging/discharging command converted from the charging/discharging power command value. On the other hand, when the charging/discharging command value is included in the dead zone, the charging/discharging controller 111 converts the charging/discharging power command value into zero and outputs a charging/discharging power command value after the conversion or a charging/discharging command of the charging/discharging power command value. In the case of a charging/discharging power command value that is originally zero, the charging/discharging controller 111 outputs the charging/discharging power command value as it is or outputs a charging/discharging command converted from the charging/discharging command value. Consequently, when the charging/discharging command value is included in the dead zone, charging and discharging in which a charging/discharging quantity is zero in the AC/DC conversion machine 112 is executed for the charging/discharging power command value. That is, the charging and discharging of the storage battery 113 is stopped. By providing the dead zone, it is possible not to perform charging and discharging of a small electric current to reduce a current value cumulative error. One of characteristics of this embodiment is that a deterioration state of the storage battery is evaluated using a transient response characteristic of a voltage of the storage battery at the time when the charging and discharging is suddenly stopped at an instance of entry into the dead zone from a state in which the charging and discharging is performed.

Figure 2:
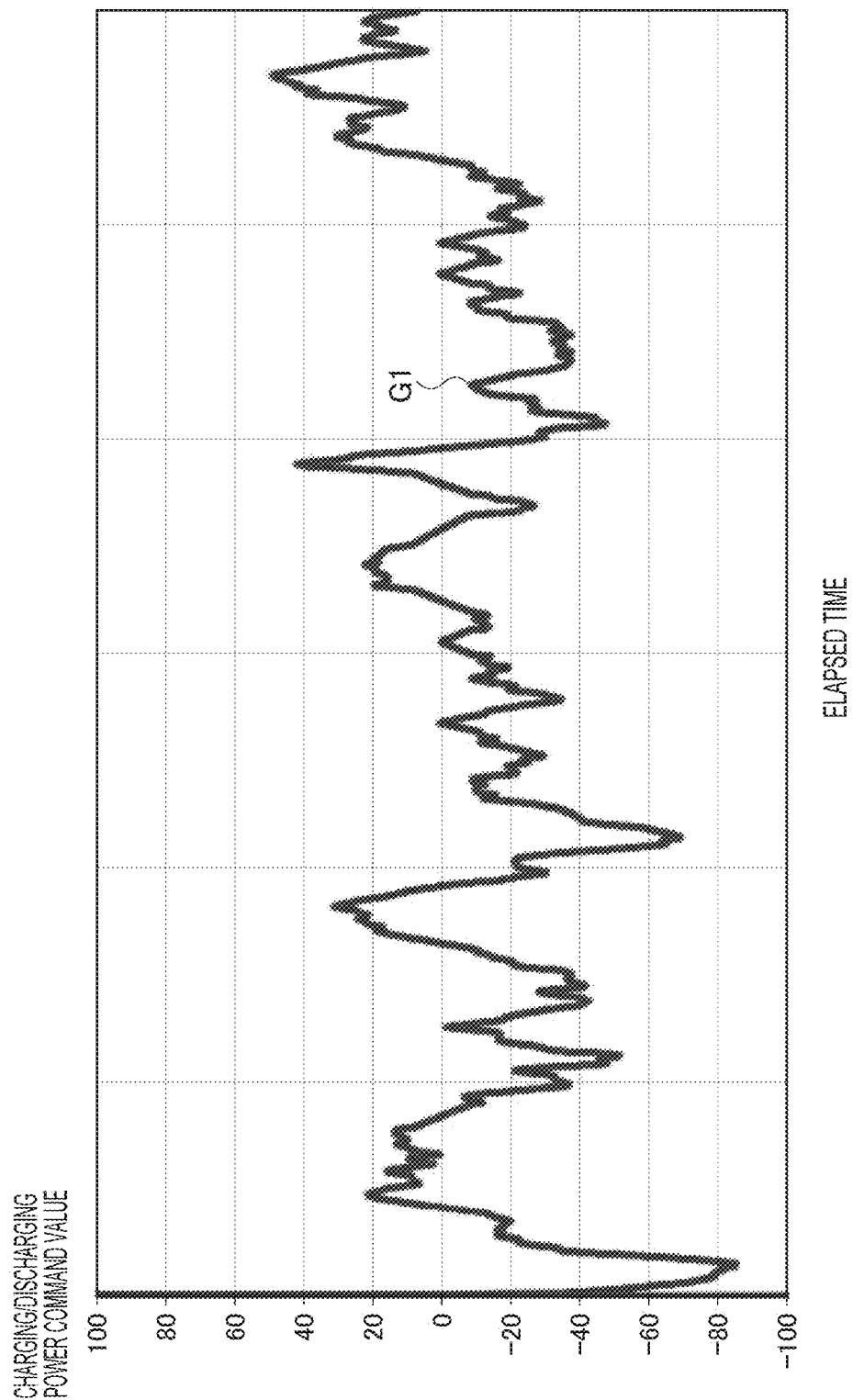
FIG. 2 is a diagram showing an example of a graph of a charging/discharging power command value.
Figure 3:
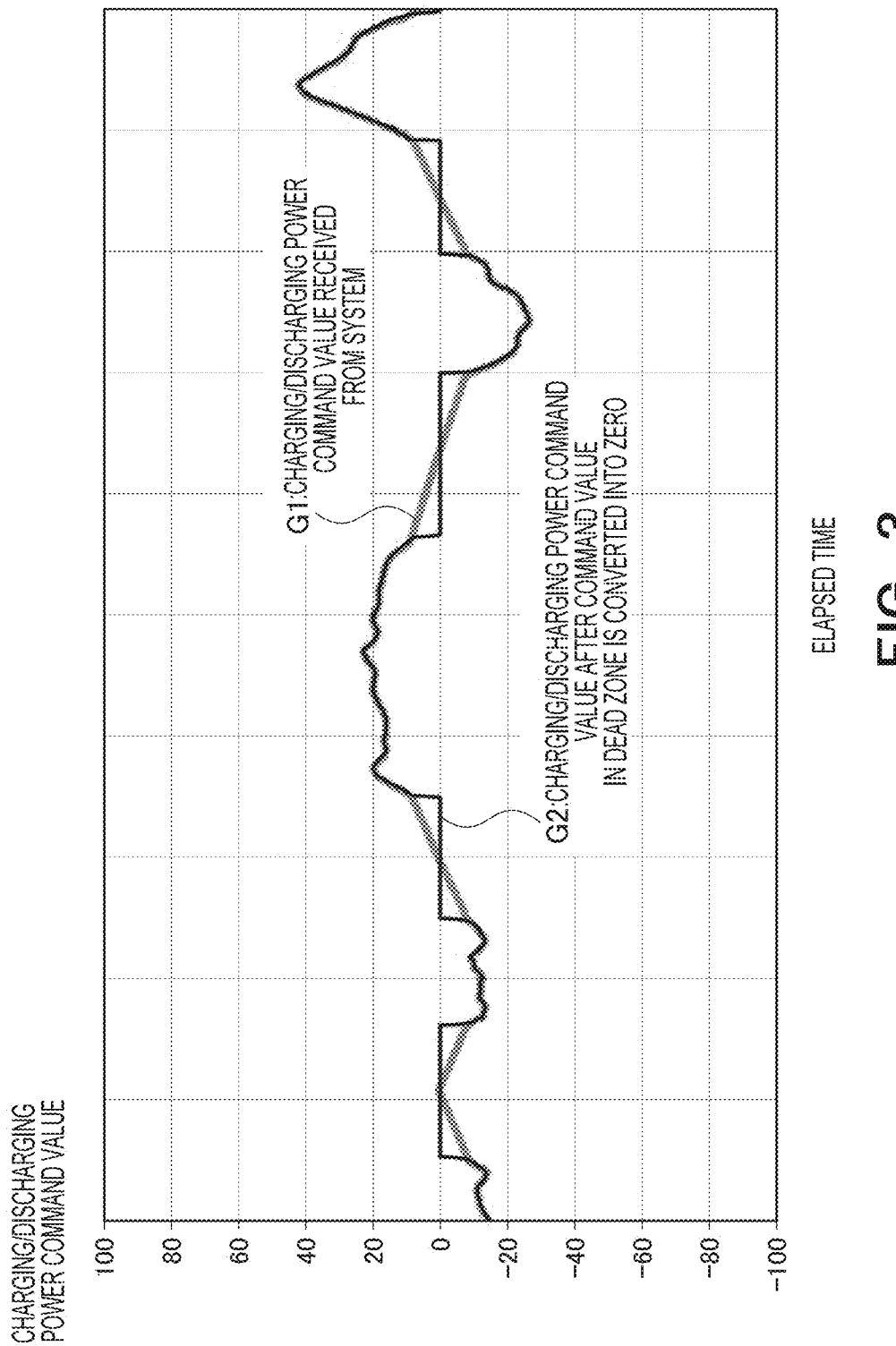
FIG. 3 is a diagram showing an example of a graph of a charging/discharging power command value after the charging/discharging power command value included in a dead zone is converted into zero.

In FIG. 2, an example of a graph G1 of a charging/discharging power command value received from the SCADA 201 is shown. The horizontal axis represents an elapsed time and the vertical axis represents a charging/discharging power command value. The charging/discharging power command value indicates, for example, charging power or discharging power (W). In FIG. 2, the charging/discharging power command value is normalized. In FIG. 3, an example of a graph G2 of a charging/discharging power command value after the charging/discharging power command value included in the dead zone is converted into zero is shown. In a section other than the dead zone, the graph G1 and the graph G2 coincide. Note that the entry into the dead zone is halfway in the charging in some case and the entry into the dead zone is halfway in the discharging in other cases. Both the cases are shown in FIG. 3.

Figure 4A:
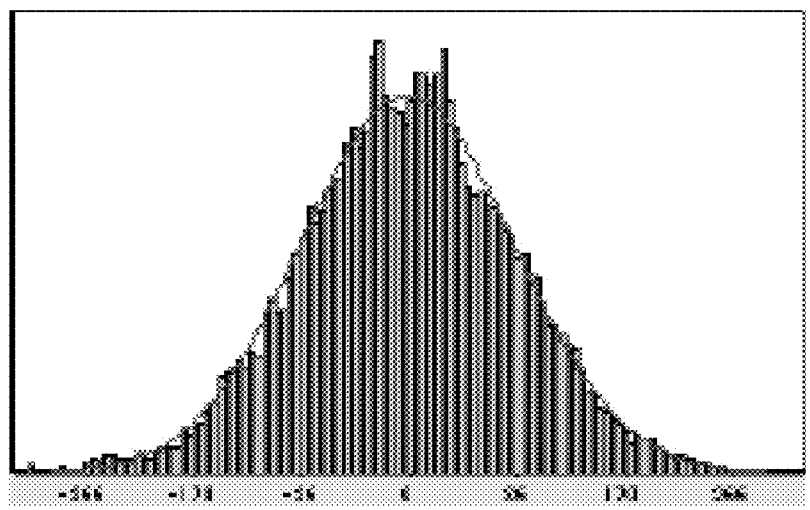
FIGS. 4A and 4B are diagrams showing examples of distributions of charging/discharging power command values.
Figure 4B:
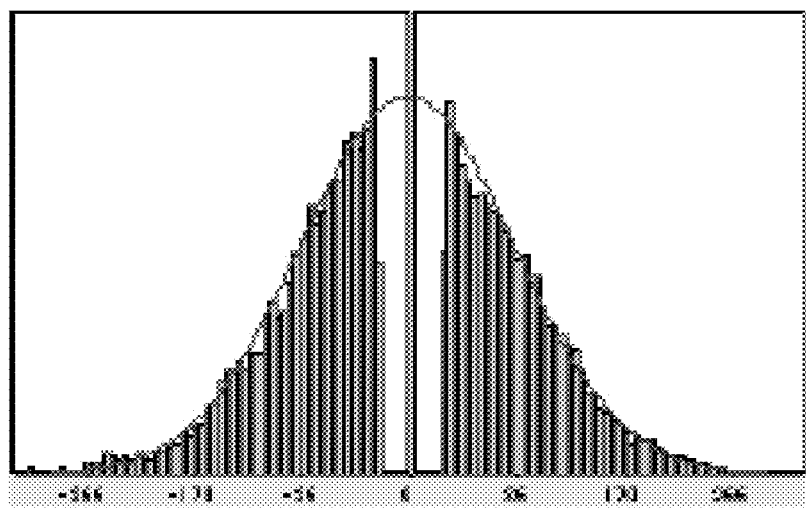

In FIG. 4A, an example of a distribution of charging/discharging power command values is shown. The horizontal axis represents a charging/discharging power command value and the vertical axis represents a frequency. A histogram and a normal distribution approximating the histogram are shown. In FIG. 4B, an example of a distribution after all charging/discharging power command values included in the dead zone are converted into zero is shown. Since all the charging/discharging power command values near zero are converted into zero, a frequency of zero is extremely high near zero of the horizontal axis.

The AC/DC conversion machine 112 has a function of bilaterally converting alternating-current power on the system 401 side and direct-current power on the storage battery 113 side. The AC/DC conversion machine 112 may include a single AC/DC converter. Alternatively, as the AC/DC conversion machine 112, two or more kinds of converters among an AC/DC converter, a DC/DC converter, and an AC/AC converter may be optionally connected. For example, the AC/DC converter and the DC/DC converter may be directly connected. The AC/AC converter and the AC/DC converter may be directly connected. The AC/AC converter, the AC/DC converter, and the DC/DC converter may be connected in series in this order. The AC/DC conversion machine 112 performs execution of charging and discharging to and from the storage battery 113 according to a charging/discharging command from the charging/discharging controller 111.

The storage battery 113 is a storage battery capable of storing (charging) and discharging electric energy. The storage battery 113 includes, for example, one or more battery boards. As an example, each of the battery boards includes one or more battery modules and one BMU (Battery Management Unit: battery monitor). Each of the battery modules includes a plurality of unit batteries (cells). Each of the battery modules may include one CMU (Cell Monitoring Unit: cell monitor). The numbers of battery modules included in the battery boards may be the same or may be different. The numbers of cells included in the battery modules may be the same or may be different. Each of the battery boards and each of the battery modules include one BMU and one CMU. However, each of the battery boards and each of the battery modules may include a plurality of BMUs and a plurality of CMUs. The storage battery 113 discharges, according to a discharging instruction from the AC/DC conversion machine 112, electric power stored in a cell group to the AC/DC conversion machine 112 or charges, according to a charging instruction from the AC/DC conversion machine 112, in the cell group, electric power supplied from the system 401 via the AC/DC conversion machine 112. All of the cell, the battery module, the battery board, and the storage battery are forms of an energy storage device that stores electric energy on the inside.

Figure 5:
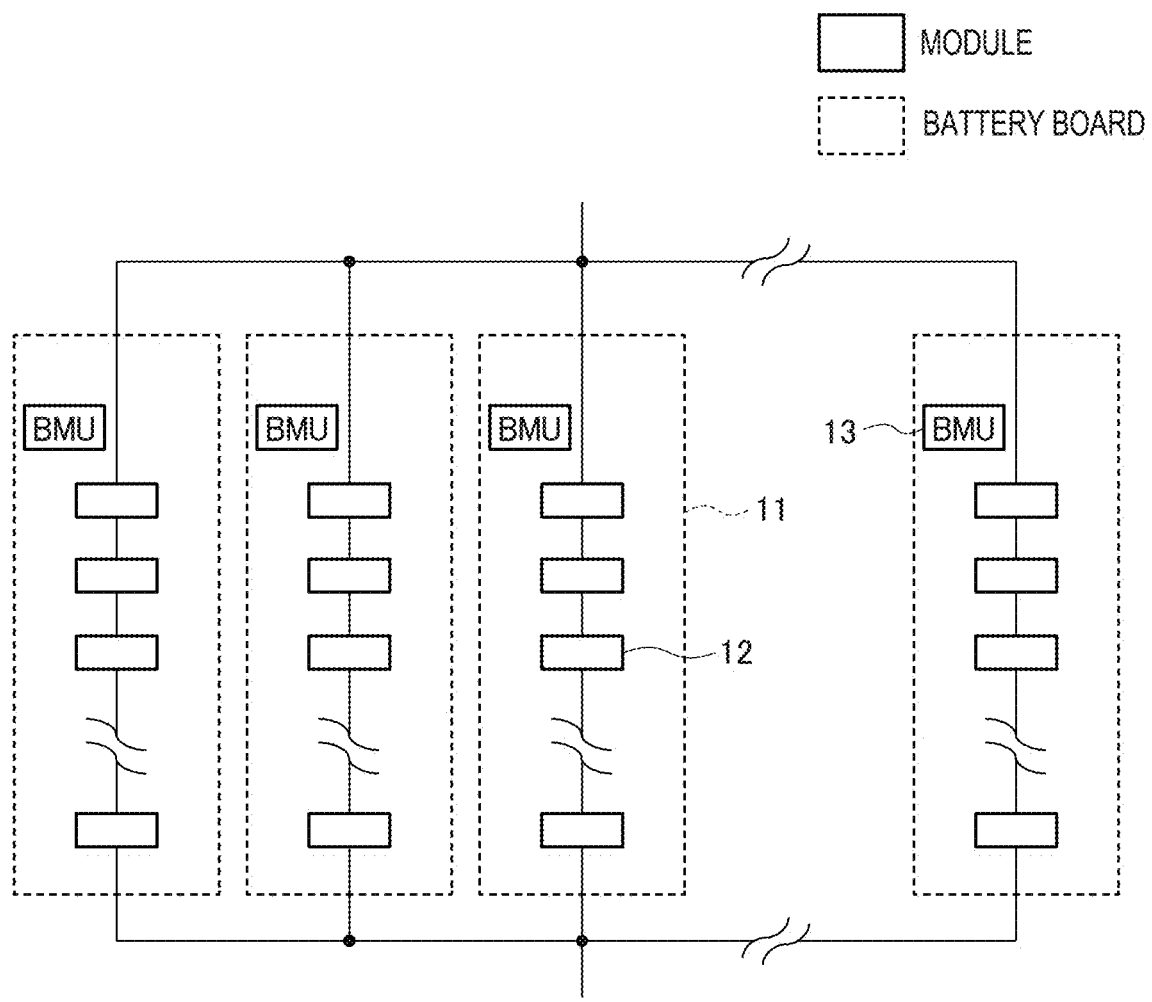
FIG. 5 is a diagram showing a configuration example of a storage battery.

FIG. 5 is a diagram showing a configuration example of the storage battery. A plurality of battery boards 11 are connected in parallel to configure a battery array. In each of the battery boards 11, a plurality of battery modules 12 are connected in series. Each of the battery boards 11 includes a BMU 13. The configuration shown in FIG. 5 is an example. The plurality of battery modules 12 may be connected in parallel or may be connected in series and in parallel. The plurality of battery boards may be connected in series or in series and in parallel. The BMU 13 may include a communicator that transmits and receives information to and from the state evaluator 114. The communicator may be disposed on the inside or the outside of the battery board 11 as a function independent from the BMU 13.

Figure 6:
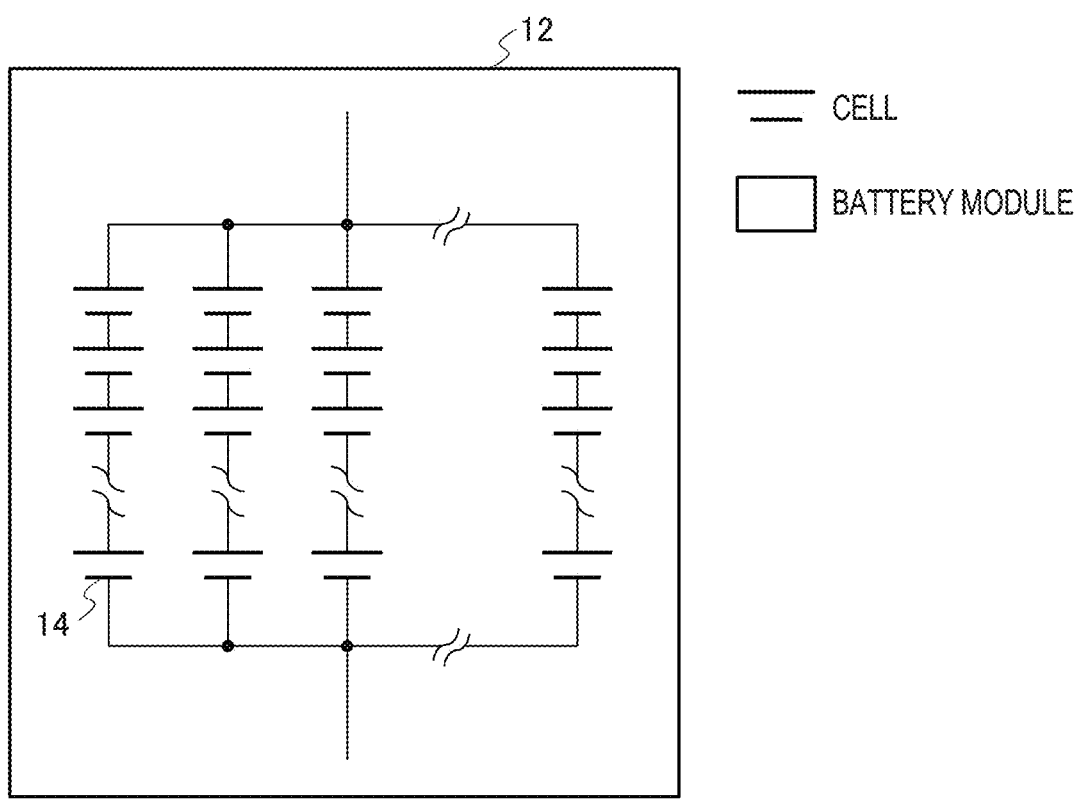
FIG. 6 is a diagram showing an example of the configuration of a battery module.

FIG. 6 is a diagram showing an example of the configuration of the battery module 12. The battery module 12 includes a configuration in which a plurality of cells 14 are connected in series and in parallel. The configuration shown in FIG. 6 is an example. Other configurations are also possible. For example, a form in which the plurality of cells 14 are connected only in series and a form in which the plurality of cells 14 are connected only in parallel are also possible. In the example shown in FIG. 6, a CMU may be included in the battery module 12. The cell 14 is a secondary battery that can be charged and discharged. Examples of the secondary battery include a lithium ion battery, a lithium ion polymer battery, a lead storage battery, a nickel cadmium battery, and a nickel hydrogen battery.

A measurer (not shown in the figure) that measures parameters such as a voltage, an electric current, and a temperature is disposed in each of the cells. Similarly, a measurer (not shown in the figure) that measures parameters such as a voltage, an electric current, and a temperature of the battery module 12 is disposed in each of the battery modules 12. A measurer (not shown in the figure) that measures parameters such as a voltage, an electric current, and a temperature of the battery board is disposed in each of the battery boards. A measurer (not shown in the figure) that measures parameters such as a voltage, an electric current, and a temperature of the storage battery 113 is disposed in the battery array (the storage battery 113). The measurers that measure voltages, electric currents, temperatures, and the like are disposed in all the types of the energy storage devices such as the cells, the battery module, the battery board, and the storage battery 113. However, the measurer may be disposed in a part of these types of the energy storage devices. In the case of the cells, the measurers may be disposed only in a part of the cells rather than in all of the cells. The same applies to the other types of the energy storage devices (the battery modules and the battery boards). The measurers may measure other parameters such as humidity besides the voltages, the electric currents, and the temperatures. Note that a sampling frequency of the measurement of the measurers may be sufficiently high compared with a reception frequency of the charging/discharging power command value.

The storage battery 113 sends battery information concerning an evaluation target energy storage device (one cell, one battery module, one battery board, a storage battery, etc.) to the state evaluator 114. The battery information includes the parameters (the voltage, the electric current, the temperature, etc.) measured by the measurer.

The storage battery 113 may include an auxiliary cell, an auxiliary battery module, or an auxiliary battery board. In this case, when a failure of a cell, a battery module, or a battery board occurs, the cell, the battery module, or the battery board may be replaced with the auxiliary cell, the auxiliary battery module, or the auxiliary battery board.

The state evaluator 114 acquires battery information of the evaluation target energy storage device from the storage battery 113. The state evaluator 114 acquires a charging/discharging power command value from the charging/discharging controller 111. The state evaluator 114 evaluates a deterioration state of the evaluation target energy storage device on the basis of the battery information and the charging/discharging power command value. The state evaluator 114 transmits ESS state information including the deterioration state of the energy storage device to the ESS monitoring system 301.

Figure 7:
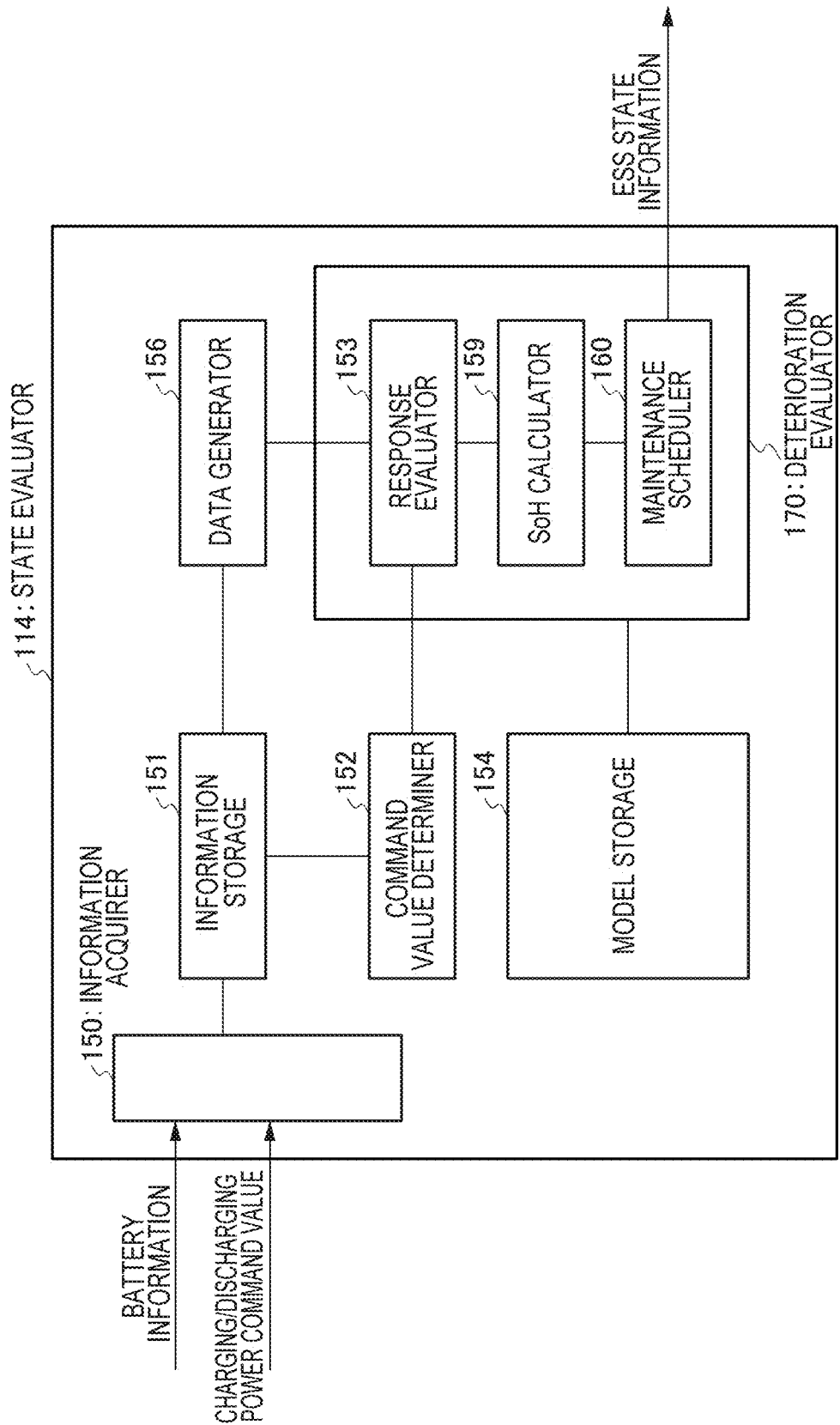
FIG. 7 is a block diagram showing the configuration of a state evaluator.

FIG. 7 is a block diagram showing the configuration of the state evaluator 114. The state evaluator 114 includes an information acquirer 150, an information storage 151, a command value determiner 152, a model storage 154, a data generator 156, and a deterioration evaluator 170. The deterioration evaluator 170 includes a response evaluator 153, an SoH calculator 159, and a maintenance scheduler 160.

The information acquirer 150 is electrically connected to the storage battery 113. The information acquirer 150 receives battery information (an electric current, a voltage, a temperature, etc.) of an evaluation target energy storage device from the storage battery 113. The information storage 151 stores, on the inside, the battery information acquired by the information acquirer 150. Time information may be added to the battery information. The information storage 151 may store the battery information in time series on the basis of the time information. Alternatively, the information storage 151 may acquire time information from a clock that counts time and store the acquired battery information in association with the time information.

The information acquirer 150 acquires a charging/discharging power command value from the charging/discharging controller 111. The information storage 151 stores, on the inside, the charging/discharging power command value acquired by the information acquirer 150. Time information may be added to the charging/discharging power command value. Alternatively, the information storage 151 may acquire time information from the clock that counts time and store the acquired charging/discharging power command value in association with the time information.

Figure 8A:
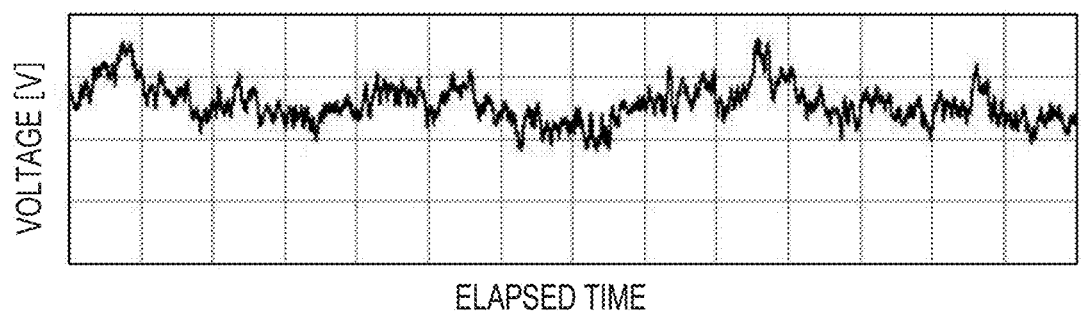
FIGS. 8A and 8B are diagrams showing graph examples of voltage data and current data.

In FIG. 8A, a graph of data (voltage data) in which voltage values included in battery information are plotted is shown.

Figure 8B:
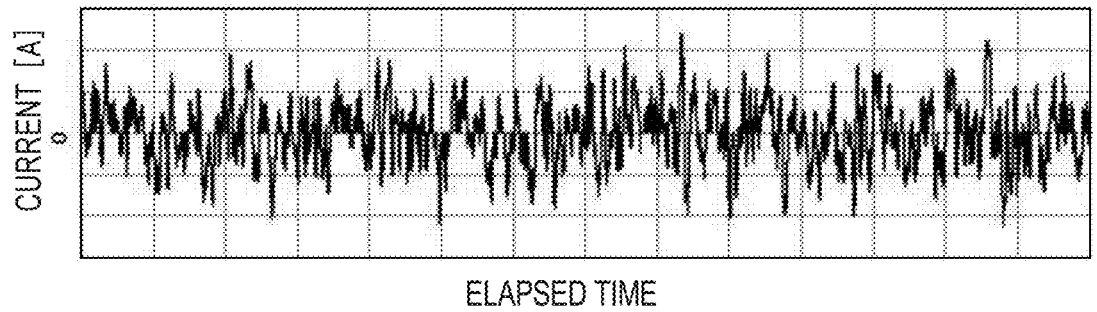

In FIG. 8B, a graph of data (current data) in which current values included in the battery information are plotted is shown. A value larger than 0 represents a discharging current and a value smaller than 0 represents a charging current.

Figure 9A:
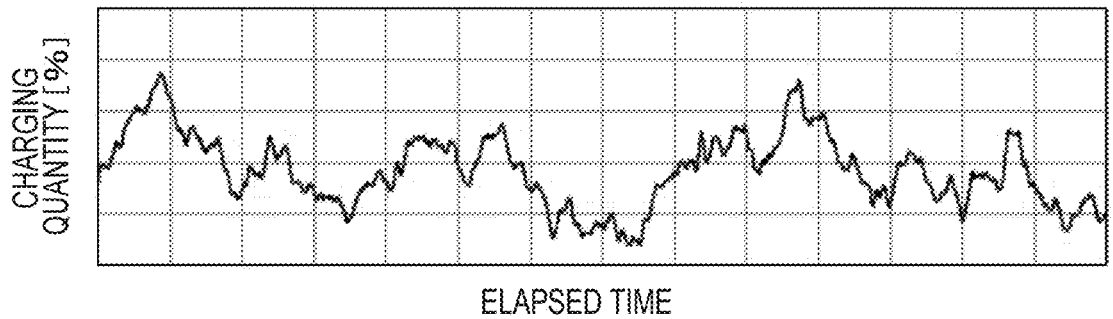
FIGS. 9A and 9B are diagrams showing graph examples of charging quantity data and temperature data.

In FIG. 9A, a graph of data in which charging quantities of the energy storage device are plotted is shown. The charging quantity is represented by SoC (State Of Charge). A unit of the SoC is %. Note that the charging quantity may be optionally decided; for example, a charging quantity of 0 may be set as 0% and a charging quantity of a specified capacity may be set as 100% or a lower limit of a predetermined range may be set as 0% and an upper limit of the predetermined range may be set as 100%. This graph is obtained by accumulating (integrating) charged or discharged electric currents from a charging quantity at a charging/discharging start time (a charging quantity in an initial state). When information concerning a charging quantity is included in the battery information output by the storage battery 113, a graph of the SoC may be acquired using this information.

Figure 9B:
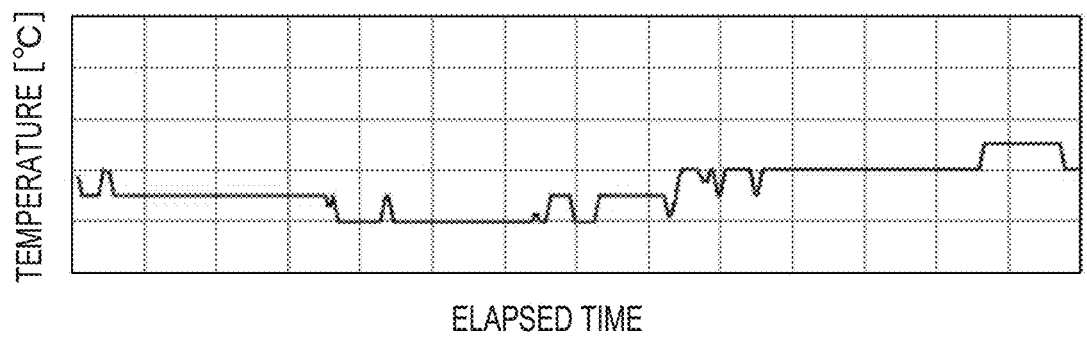

In FIG. 9B, a graph of data in which temperatures of the energy storage device are plotted is shown. Instead of the temperatures, an average of temperatures from the charging/discharging start time or an average of temperatures before a fixed time may be used.

Items other than the items shown in FIGS. 8A to 9B may be included in the battery information. Items that can be calculated from a plurality of items included in the battery information may be defined. Data of the items may be acquired.

Figure 10:
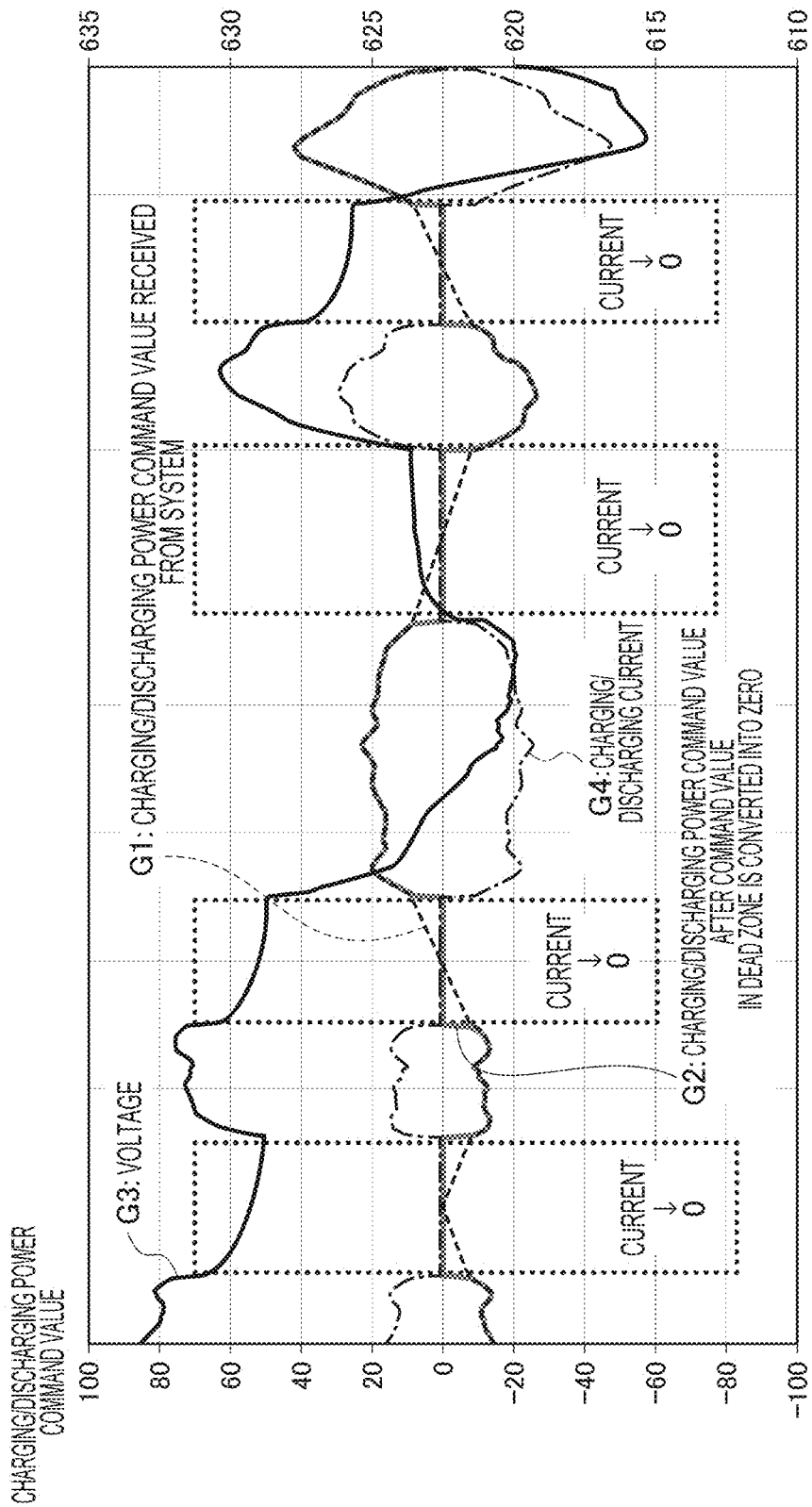
FIG. 10 is a diagram indicating that a charging/discharging current decreases to zero in a dead zone.

In FIG. 10, a graph G3 of a voltage and a graph G4 of a charging/discharging current are superimposed on the graphs G1 and G2 shown in FIG. 3. In the dead zone, since the charging and discharging is stopped, the charging/discharging current is zero. In the dead zone, since the charging/discharging current is zero, the voltage suddenly drops immediately after the entry into the dead zone.

The data generator 156 creates, on the basis of the information stored in the information storage 151, data in which time t, a charging quantity Q, a voltage V, an electric current I, and a temperature T are associated. For example, the data generator 156 creates the data in response to a request from the response evaluator 153 or the command value determiner 152. Items included in the data do not need to be limited to the items enumerated here. A part of the items may be absent or other items may be added.

The command value determiner 152 checks, along a time, the information stored in the information storage 151 and detects time when the information changes from a non-zero value to zero (time of entry into the dead zone). Thereafter, the command value determiner 152 detects time when the information changes from zero to non-zero earliest (time of leaving from the dead zone). Note that a charging/discharging command value included in the dead zone is zero when an originally received charging/discharging power command value is zero in some case and when the charging/discharging power command value, a value of which after conversion is zero, in other cases. The command value determiner 152 notifies the time of the entry into the dead zone (time immediately before the entry) and time immediately before the leaving from the dead zone (or time immediately after the leaving) to the deterioration evaluator 170.

The deterioration evaluator 170 measures a response characteristic of a voltage of the energy storage device at the time of the entry into the dead zone from a state in which the energy storage device is charged or discharged and evaluates a deterioration state of the energy storage device using the response characteristic.

Figure 11:
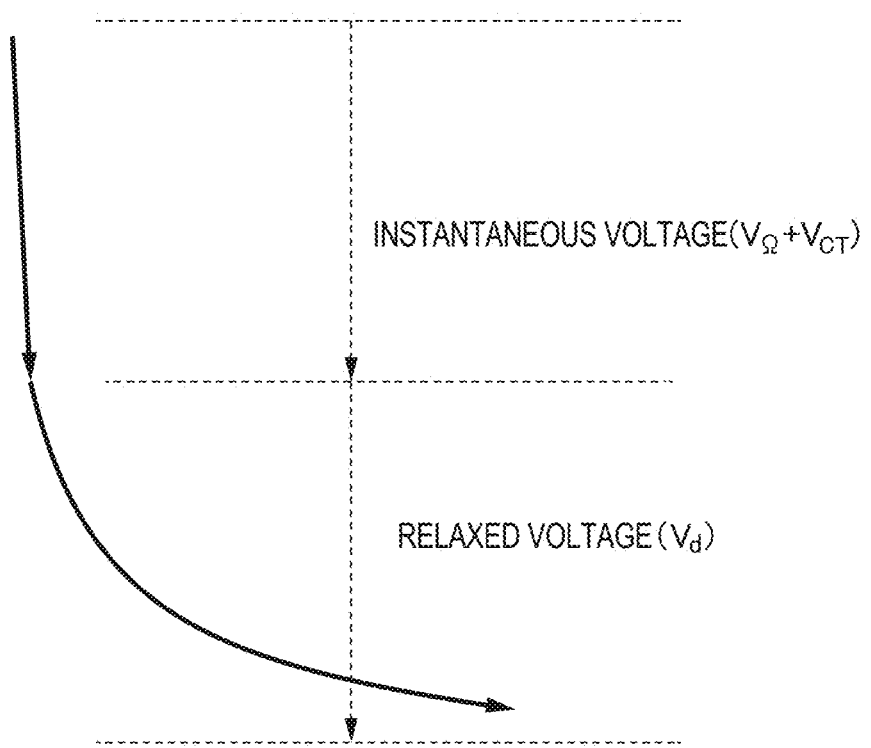
FIG. 11 is a diagram for explaining a response characteristic of a voltage.

The response characteristic of the voltage of the energy storage device at the time of the entry into the dead zone is explained. In FIG. 11, the response characteristic of the voltage at the time of the entry into the dead zone is schematically shown. Resistance R of the energy storage device is represented as a sum of ohmic resistance $R_\Omega$, reaction resistance $R_{CT}$, and diffused resistance $R_d$. Since time constants of the ohmic resistance $R_\Omega$ and the reaction resistance $R_{CT}$ are zero or small, when an electric current fluctuates, a voltage change corresponding to an amount of the fluctuation appears immediately after the fluctuation. Voltage fluctuation at this time is sometimes called instantaneous voltage as shown in FIG. 11. The instantaneous voltage is a sum of voltage fluctuation $V_\Omega$ corresponding to the ohmic resistance and voltage fluctuation $V_{CT}$ corresponding to the reaction resistance. The instantaneous voltage=$(R_\Omega+R_{CT})\times I$. Usually, $R_\Omega > R_{CT}$ and the voltage linearly instantaneously fluctuates. The ohmic resistance $R_\Omega$ and the reaction resistance $R_{CT}$ are sometimes collectively called instantaneous resistance. On the other hand, the diffused resistance $R_d$ involves a time constant of a certain magnitude. Therefore, when an electric current fluctuates, a voltage change appears in a time corresponding to the time constant. This voltage fluctuation is sometimes called relaxed voltage $V_d$ as shown in FIG. 11. The relaxed voltage $V_d$ can be represented as follows using variables A and B and the time t.

$$Vd = A \times \ln(t) + B \quad \text{Equation (1)}$$

where "ln" represents a logarithm, "×" represents multiplication, and "+" represents addition.

Such a response characteristic is the same as a response characteristic of a voltage obtained when impulse-like charging and discharging is performed on the energy storage device. In this case, end time of the impulse (an end point in time of supply of the electric current) is equivalent to time immediately before the entry into the dead zone.

Figure 12:
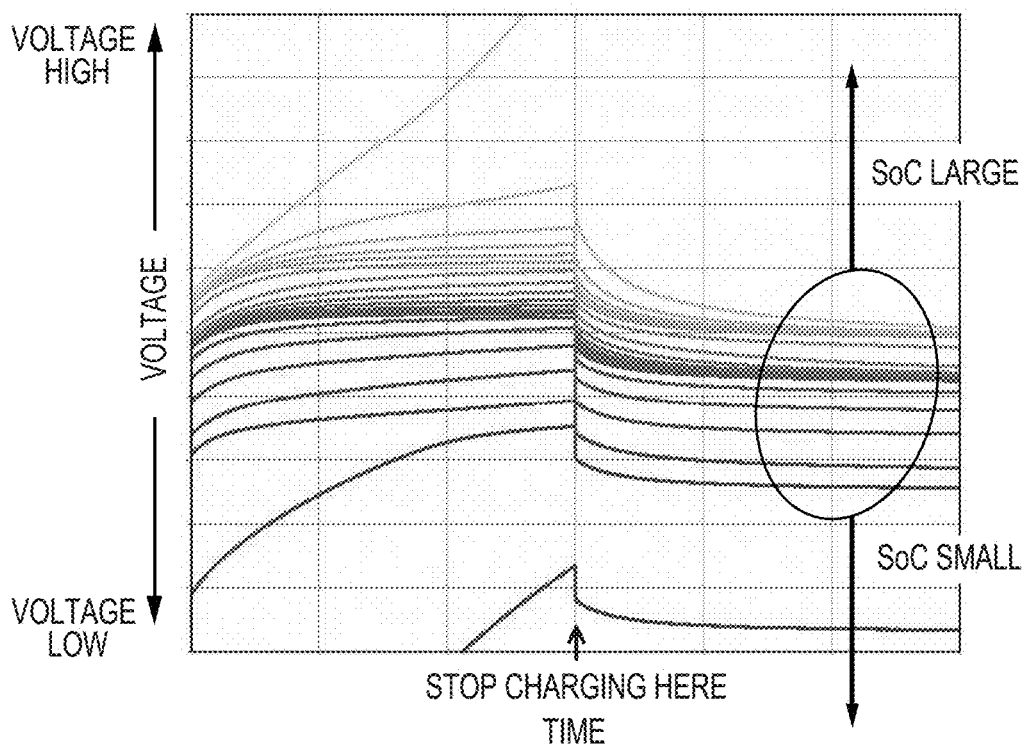
FIG. 12 is a diagram showing a response characteristic of a normal energy storage device.

In FIG. 12, an example of a response of a voltage at the time when impulse is applied in various charging states (SoCs) using a normal energy storage device (a new energy storage device) is shown. A plurality of graphs are shown in the figure. A graph on an upper side along the paper surface has a larger SoC. A graph on a lower side has a smaller SoC. The horizontal axis represents an elapsed time from the application of the impulse (a step charging start) and the vertical axis represents a voltage. Impulse having length of time 0 to time TA is applied. A voltage drops immediately after an application end according to the same characteristic as the characteristic shown in FIG. 11.

Figure 13:
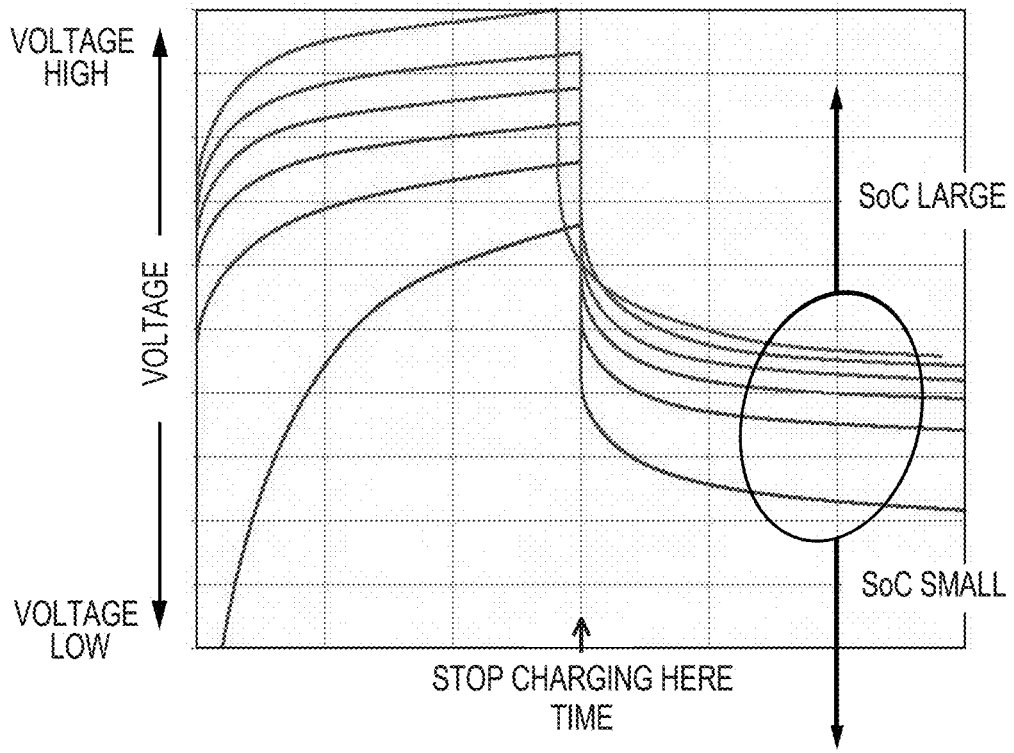
FIG. 13 is a diagram showing a response characteristic of a deteriorated energy storage device.

In FIG. 13, an example of a response of a voltage at the time when impulse is applied in various charging states (SoCs) using a deteriorated energy storage device is shown. Measurement is performed under the same conditions as the conditions shown in FIG. 12. As it is seen when FIG. 13 is compared with FIG. 12, in the deteriorated energy storage device, a rise of the voltage at the time when the impulse is applied is significant. According to the rise of the voltage, the widths of an instantaneous voltage drop immediately after an application end of the impulse and a relaxed voltage drop are also significant. These differences become conspicuous according to a difference of the charging state (SoC). For example, an intercept B of Equation (1) described above representing the relaxed voltage greatly changes according to the charging state.

Figure 14:
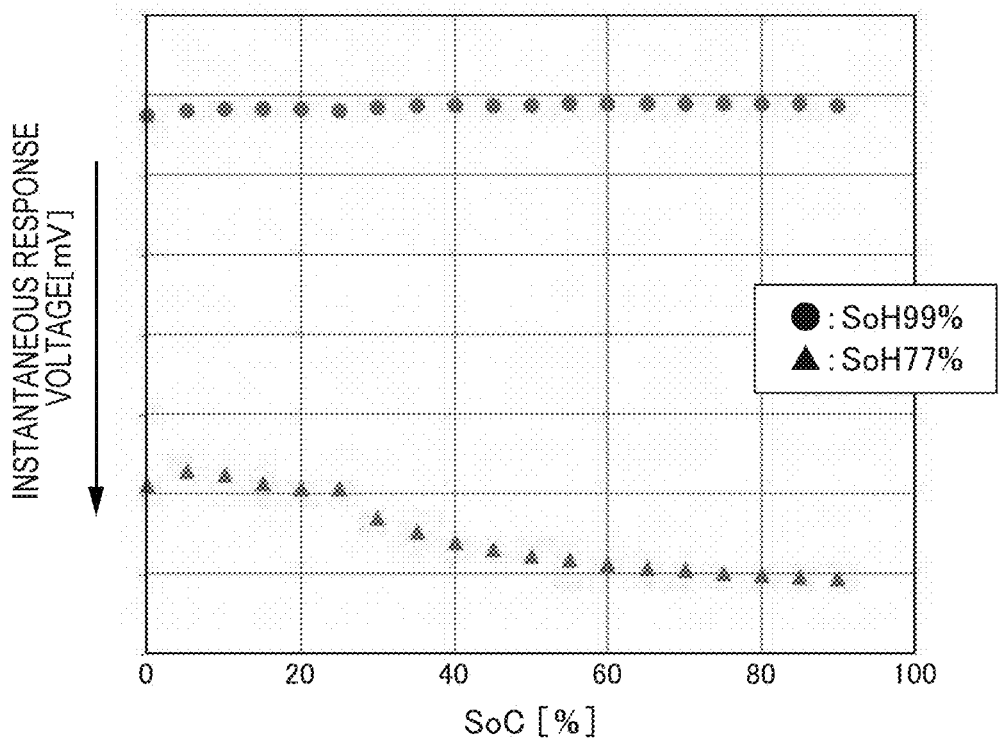
FIG. 14 is a diagram showing a response characteristic of an instantaneous voltage ($V_\Omega + V_{CT}$)

In FIG. 14, a response characteristic of an instantaneous voltage ($V_\Omega + V_{CT}$) is shown for each of charging states (SoCs) concerning each of the normal energy storage device (the new energy storage device) and the deteriorated storage device. An instantaneous response voltage is greatly different in the normal energy storage device and the deteriorated energy storage device. The amplitude (the absolute value, i.e., the distance from 0) of the instantaneous voltage is greater in the deteriorated energy storage device than in the normal energy storage device.

Figure 15:
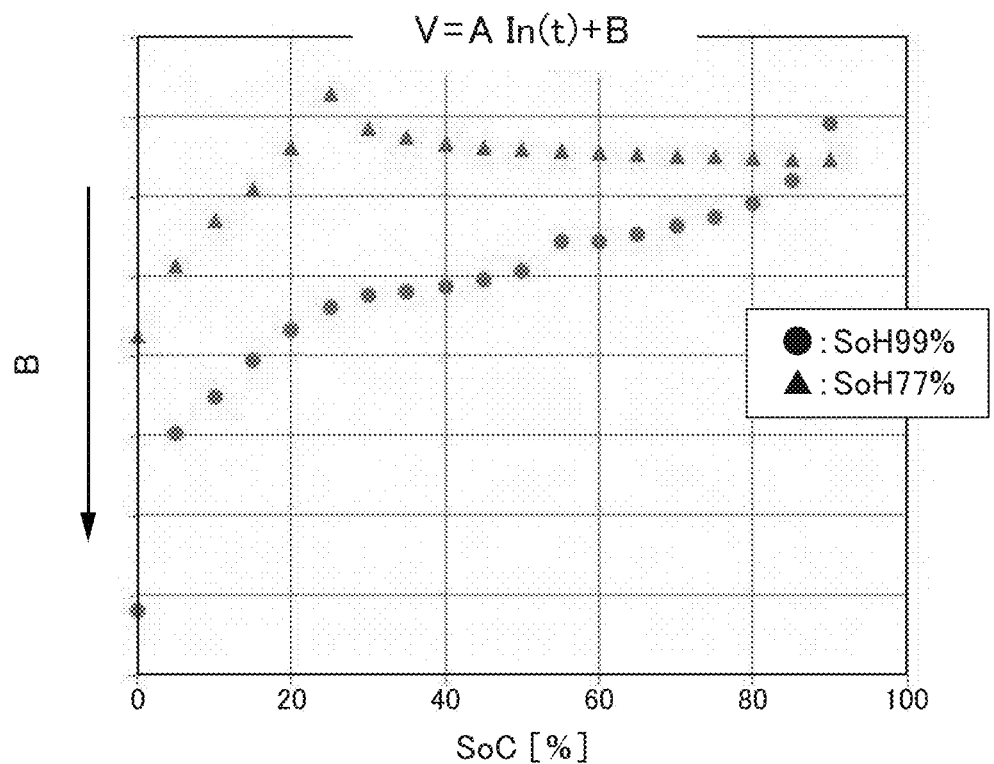
FIG. 15 is a diagram showing a response characteristic of a relaxed voltage ($V_d$)

In FIG. 15, a response characteristic of the relaxed voltage ($V_d$) is shown for each of charging states (SoCs) concerning each of the normal energy storage device (the new storage device) and the deteriorated energy storage device. A value of the variable B is shown concerning $A \times \ln(t) + B$, which is Equation (1) of the response characteristic.

The intercept (B) is greatly different in the normal energy storage device and the deteriorated energy storage device. The absolute value of the intercept (B) is larger in the deteriorated energy storage device than in the normal energy storage device. A slope at the time when values (points) of intercepts corresponding to SoCs of the normal energy storage device are linearly approximated and a slope at the time when values (points) of intercepts in SoCs of the deteriorated energy storage device are linearly approximated are compared. It is seen that the slope is smaller in the normal energy storage device than in the deteriorated energy storage device. As the linear approximation, a publicly-known method such as a method of least squares may to be used.

A deterioration state of the energy storage device is evaluated using the difference between the response characteristic of the normal energy storage device and the response characteristic of the deteriorated energy storage device explained above.

The model storage 154 stores a model for evaluating a deterioration state of the energy storage device from the response characteristic of the energy storage device.

Figure 16:
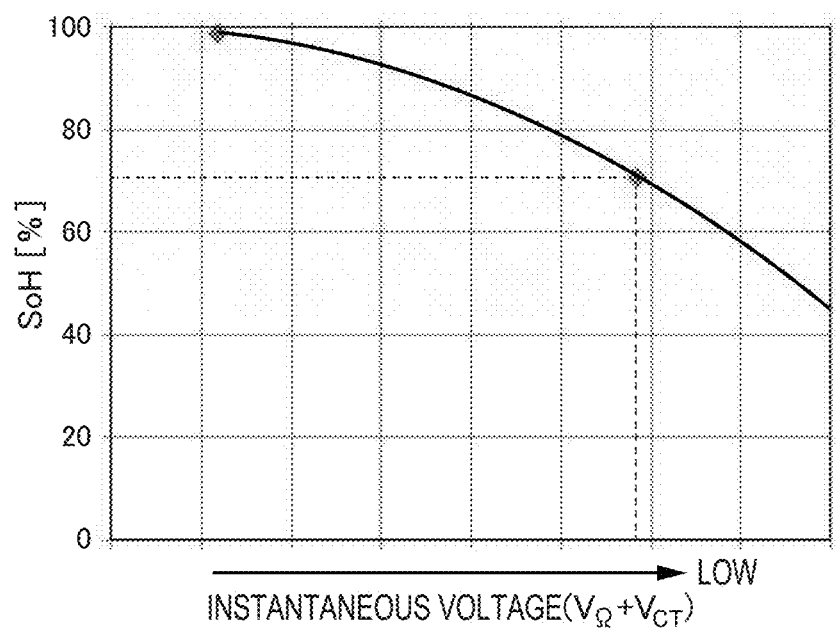
FIG. 16 is a diagram showing an example of a model.

In FIG. 16, an example of a model is shown. The instantaneous voltage ($V_\Omega + V_{CT}$) and the deterioration state (an SoH: State of Health) are associated. This model may be represented by a table or may be represented by a function.

The deterioration state (the SoH) may be any index as long as the index represents a deterioration condition of the energy storage device. For example, the deterioration state (SoH) may be a ratio of a present capacity to an initial capacity (the present capacity/the initial capacity). Alternatively, a value of internal resistance or values of other types may be used.

The model of FIG. 16 can be generated by acquiring relations between instantaneous voltages and SoHs targeting energy storage devices having various deterioration states. A deterioration state can be specified from an instantaneous voltage measured from an inspection target energy storage device on the basis of this model. The instantaneous voltage of this model may be, for example, an average of instantaneous voltages measured in a plurality of SoCs within a predetermined range. In the following explanation, it is assumed that the instantaneous voltage is the average. In the example explained above, the predetermined range only has to be properly measurable even in the deteriorated energy storage device.

Figure 17:
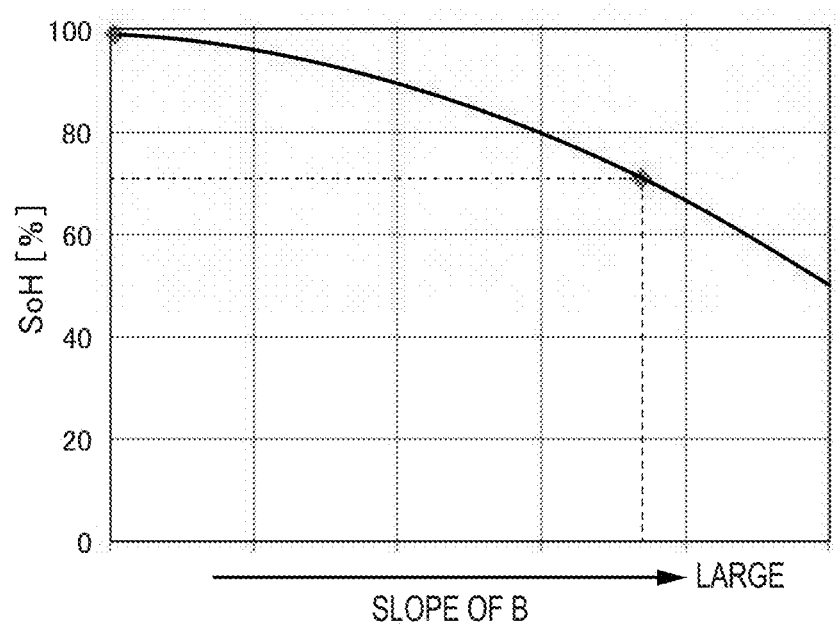
FIG. 17 is a diagram showing another example of the model.

In FIG. 17, another example of the model is shown. The slope of the intercept B and the deterioration state (the SoH: State of Health) are associated. This model may be represented by a table or may be represented by a function. The model can be generated by acquiring a relation between the slope of B and the SoH targeting energy storage devices having various deterioration states. An SoC range set as a calculation target of a slope only has to be properly measurable even in the deteriorated energy storage device. It is possible to specify a deterioration state by calculating the slope of B from B measured in a plurality of SoCs from an inspection target energy storage device and applying the calculated slope to this model.

The models shown in FIGS. 16 and 17 are examples. The models may be any models capable of specifying a deterioration state from a response characteristic of a voltage of the energy storage device. For example, a model in which the value of B and the deterioration state are associated may be constructed. A model may be constructed for each of types (model numbers, materials, etc.) of energy storage devices. In this case, a model corresponding to a type of an inspection target energy storage device only has to be used.

The response evaluator 153 of the deterioration evaluator 170 acquires, from the data generator 156, data (e.g., the time t, the charging quantity Q, the voltage V, the electric current I, and the temperature T) in a period of time from time immediately before the entry into the dead zone until the leaving from the dead zone. The response evaluator 153 calculates a value of the instantaneous voltage V or B from the data. For example, a difference between a voltage at the time immediately before the entry into the dead zone and a voltage at time of the entry into the dead zone can be calculated as the instantaneous voltage V. The value of B is obtained by calculating the variables A and B from data at the time of entry into the dead zone to time immediately before the leaving from the dead zone. Note that an SoC corresponding to the charging quantity Q may be calculated. It may be determined whether the SoC is equal to or smaller than a threshold. If the SoC is larger than the threshold, it may be determined that data of the SoC is not used.

The response evaluator 153 acquires data in the same manner every time of the entry into the dead zone and calculates a value of the instantaneous voltage V or B.

After calculating values of the instantaneous voltage V or B concerning the plurality of SoCs, the response evaluator 153 calculates an average of V or a slope of a straight line approximating B. The response evaluator 153 outputs the average of V or the slope of B to the SoH calculator 159 as a feature value.

When the average of V is used, the SoH calculator 159 reads out the model of the form shown in FIG. 16 from the model storage 154. The SoH calculator 159 specifies a deterioration state (an SoH) corresponding to the average of V on the basis of the read-out model. When the slope of B is used, the SoH calculator 159 reads out the model of the form shown in FIG. 17 from the model storage 154. The SoH calculator 159 specifies a deterioration state (an SoH) corresponding to the slope of B on the basis of the read-out model.

When other models are used, the response evaluator 153 only has to calculate a feature value corresponding to a model in use. The SoH calculator 159 only has to use a model corresponding to the feature value. For example, the SoH calculator 159 may use the value of B as the feature value. The SoH calculator 159 may use the value of V instead of the average of V. When the value of B or the value of V is used, it is possible to evaluate the deterioration state (the SoH) in one measurement (i.e., one entry into the dead zone). In this case, models are created for each of a plurality of SoCs or a plurality of SoC ranges. A model corresponding to an SoC at the present measurement time is used. As another feature value, instantaneous resistance ($R_\Omega + R_{CT}$) may be calculated. For example, the instantaneous resistance ($R_\Omega + R_{CT}$) can be calculated from the instantaneous voltage and the electric current at the time of entry into the dead zone. $R_d$ may be calculated as the feature value.

The maintenance scheduler 160 generates, on the basis of the deterioration state (the SoH) calculated by the SoH calculator 159, ESS state information representing a state of the energy storage device. In the generation of the ESS state information, the maintenance scheduler 160 may additionally use at least one of the information storage 151 and the model storage 154. The maintenance scheduler 160 transmits the ESS state information to the ESS monitoring system 301 via the communication network.

As an example of the ESS state information, the maintenance scheduler 160 may transmit information concerning operation possibility of the energy storage device. Specifically, the maintenance scheduler 160 determines operation possibility of the storage battery 113 on the basis of an SoH of the energy storage device. For example, the maintenance scheduler 160 divides a range of the SoH into three using a threshold A and a threshold B and obtains a range 1 of the SoH equal to or smaller than the threshold A, a range 2 of the SoH larger than the threshold A and equal to or smaller than the threshold B, and a range 3 of the SoH equal to or larger than the threshold B. When the SoH of the energy storage device belongs to the range 1, the maintenance scheduler 160 may determine that further operation of the storage battery 113 is impossible (i.e., the storage battery 113 has reached its end of life) and notify a message of a failure alert to the ESS monitoring system 301. When the SoH belongs to the range 2, the maintenance scheduler 160 may determine that the operation is still possible but maintenance is necessary and notify a message of maintenance call to the ESS monitoring system 301. When the SoH belongs to the range 3, the maintenance scheduler 160 may determine that the storage battery 113 is normal and can also be operated in future. In that case, the maintenance scheduler 160 may notify a message to the effect that the storage battery 113 is normal (there is no failure and maintenance is not necessary yet) to the ESS monitoring system 301. The maintenance scheduler 160 does not have to perform such notification in particular.

The method of determining the operation possibility explained above is an example. Other determination methods may be used. For example, a plurality of SoHs are calculated according to a plurality of times of deterioration evaluation. The determination of operation possibility may be performed using an average, a median, a maximum, or a minimum of these SoHs.

For example, a state transition model for determining operation possibility from transition of a feature value (the average of V, the slope of B, etc.) in use is generated in advance. The determination of operation possibility may be performed on the basis of the state transition model and a plurality of feature values calculated by a plurality of times of deterioration evaluation.

Alternatively, a model for determining a failure probability from a feature value according to a logistic regression analysis or the like is generated in advance. A failure ratio may be calculated from the model and a calculated feature value. The operation possibility may be determined from a value of the failure ratio. It is naturally possible to determine the operation possibility according to methods other than the methods illustrated above.

Besides the information concerning the operation possibility, as the ESS state information, charging/discharging power command value data (power command value data), voltage data, current data, charging quantity data, and temperature data may be transmitted. Data of a histogram of the charging/discharging power command value or a normal distribution approximating the histogram may be transmitted. The model used in specifying the deterioration state may be transmitted. Information indicating the deterioration state (the SoH) obtained this time may be transmitted. Data other than the data explained above may be transmitted.

The ESS monitoring system 301 receives the ESS state information from the ESS 101 and displays, on the basis of the ESS state information, a screen for an administrator to evaluate a state of the storage battery 113 (a deterioration state evaluation screen) on a display device. When the operation possibility information is included in the ESS state information, the ESS monitoring system 301 may perform operation corresponding to the operation possibility information. For example, when the operation possibility information indicates operation impossibility, the ESS monitoring system 301 may display a message of a failure alert on the screen. When the operation is possible but maintenance is necessary, the ESS monitoring system 301 may display a message of maintenance call on the screen. When the storage battery 113 is normal, the ESS monitoring system 301 may display a message for notifying the normality of the storage battery 113 on the screen. Besides the display on the screen, the ESS monitoring system 301 may output, via a speaker, message sound for notifying the failure alert, the maintenance call, or the normality of the storage battery 113. The ESS monitoring system 301 may notify the operation state of the ESS 101 by displaying a color on the screen (e.g., lighting the screen), for example, red for the operation impossibility, yellow when the operation is possible but maintenance is necessary, and green when the storage battery 113 is normal.

Figure 18:
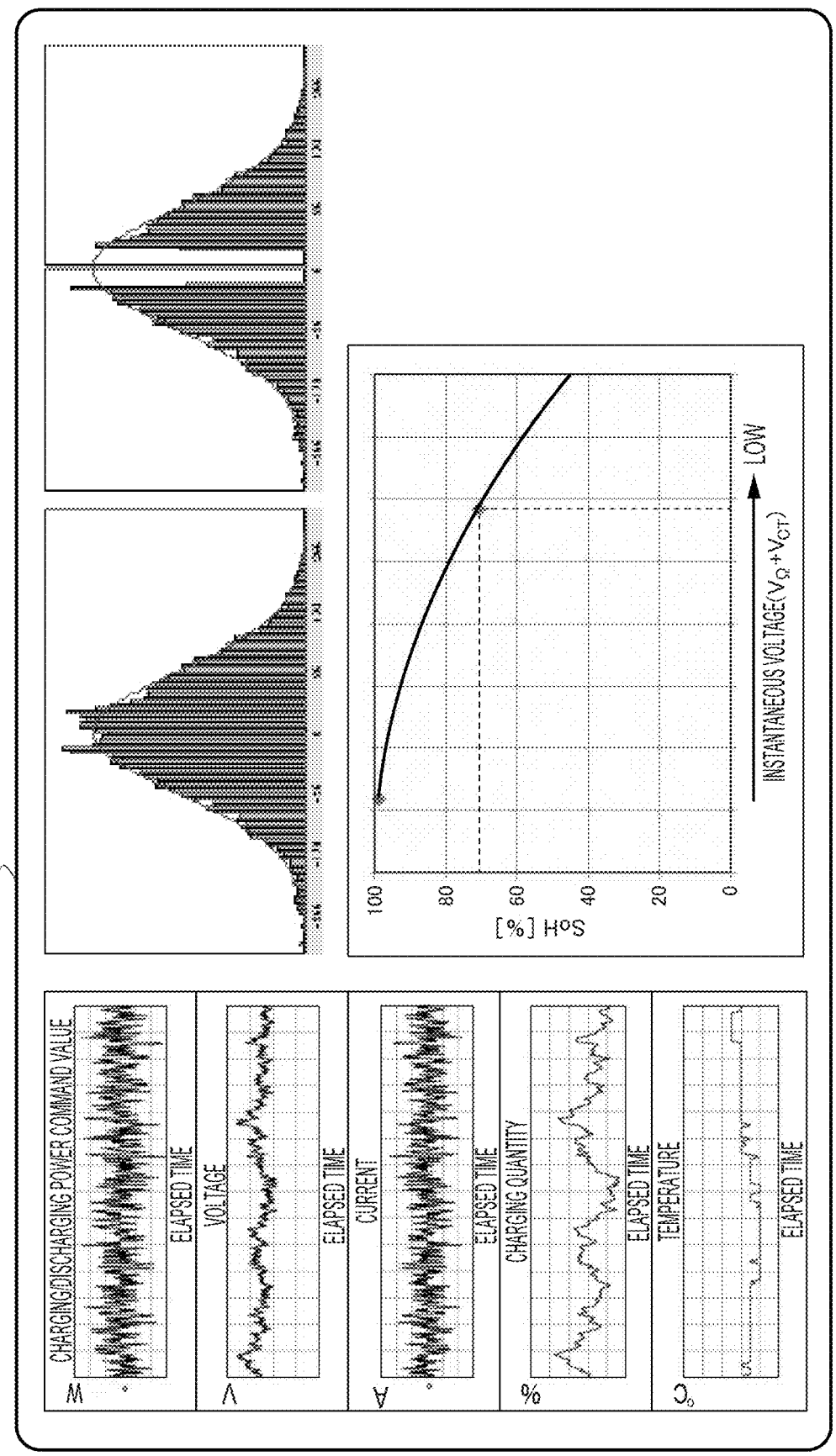
FIG. 18 is a diagram showing an example of a deterioration state evaluation screen.
Figure 19:
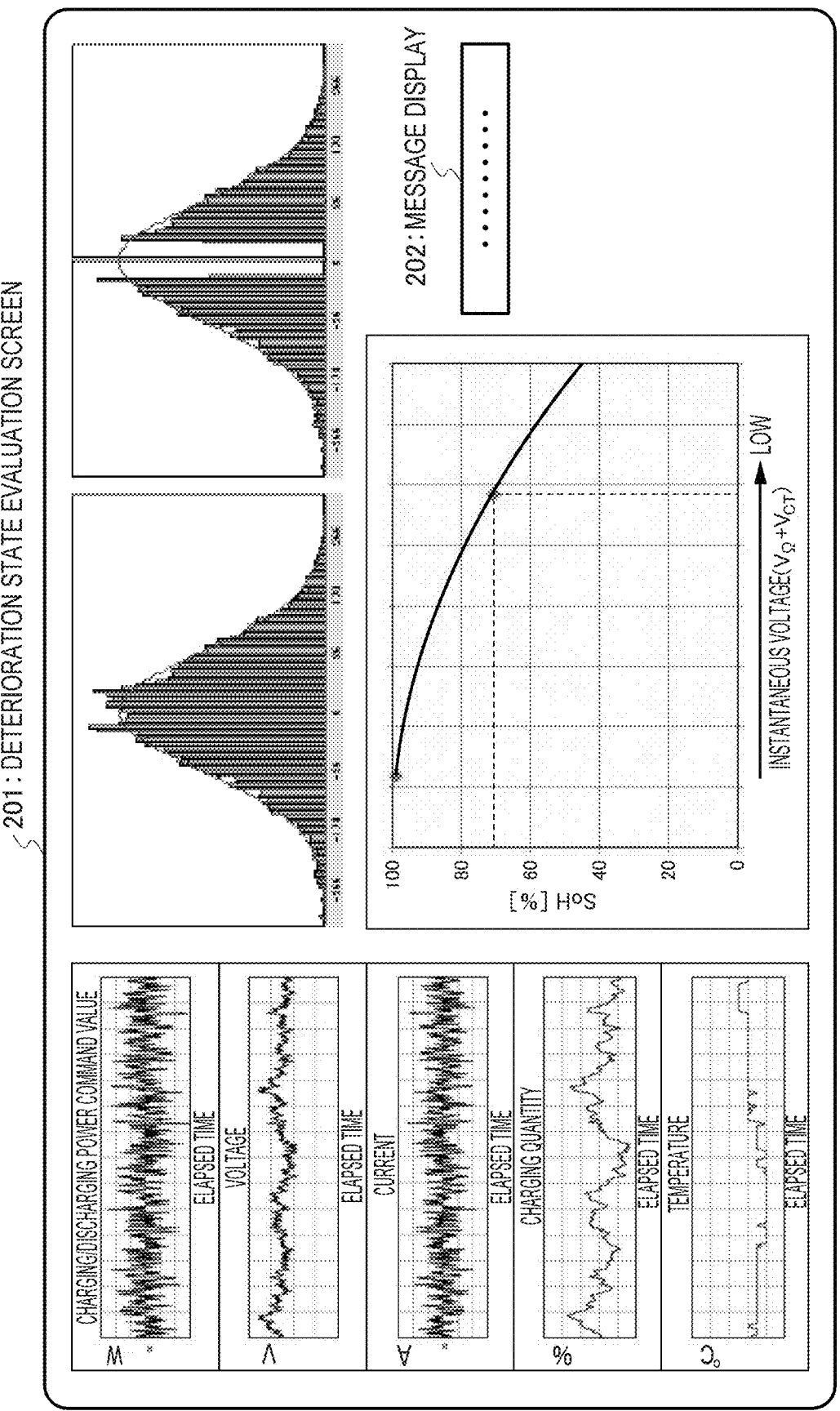
FIG. 19 is a diagram showing another example of the deterioration state evaluation screen.

In FIG. 18, an example of the deterioration state evaluation screen displayed on the display device of the ESS monitoring system 301 is shown. On the left side of the screen, charging/discharging power command value data (power command value data), voltage data, current data, charging quantity data, and temperature data are displayed. In the center, a distribution of charging/discharging power command values received from the SCADA 201, a distribution in which a charging-discharging power command value in a dead zone is converted into zero, and a model in use are displayed. The administrator can monitor a state of the storage battery 113 by viewing this screen. A message display for displaying various messages may be disposed on the deterioration state evaluation screen. An example of the deterioration state evaluation screen including the message display is shown in FIG. 19. A message corresponding to the state of the storage battery 113 is displayed on the message display 202. For example, when it is determined that the operation of the storage battery 113 is impossible, a message of a failure alert such as "the storage battery 113 is out of order" is displayed. " . . . " in the figure represents a state in which any message is displayed. Note that the message may be displayed by another method such as popup display.

Figure 20:
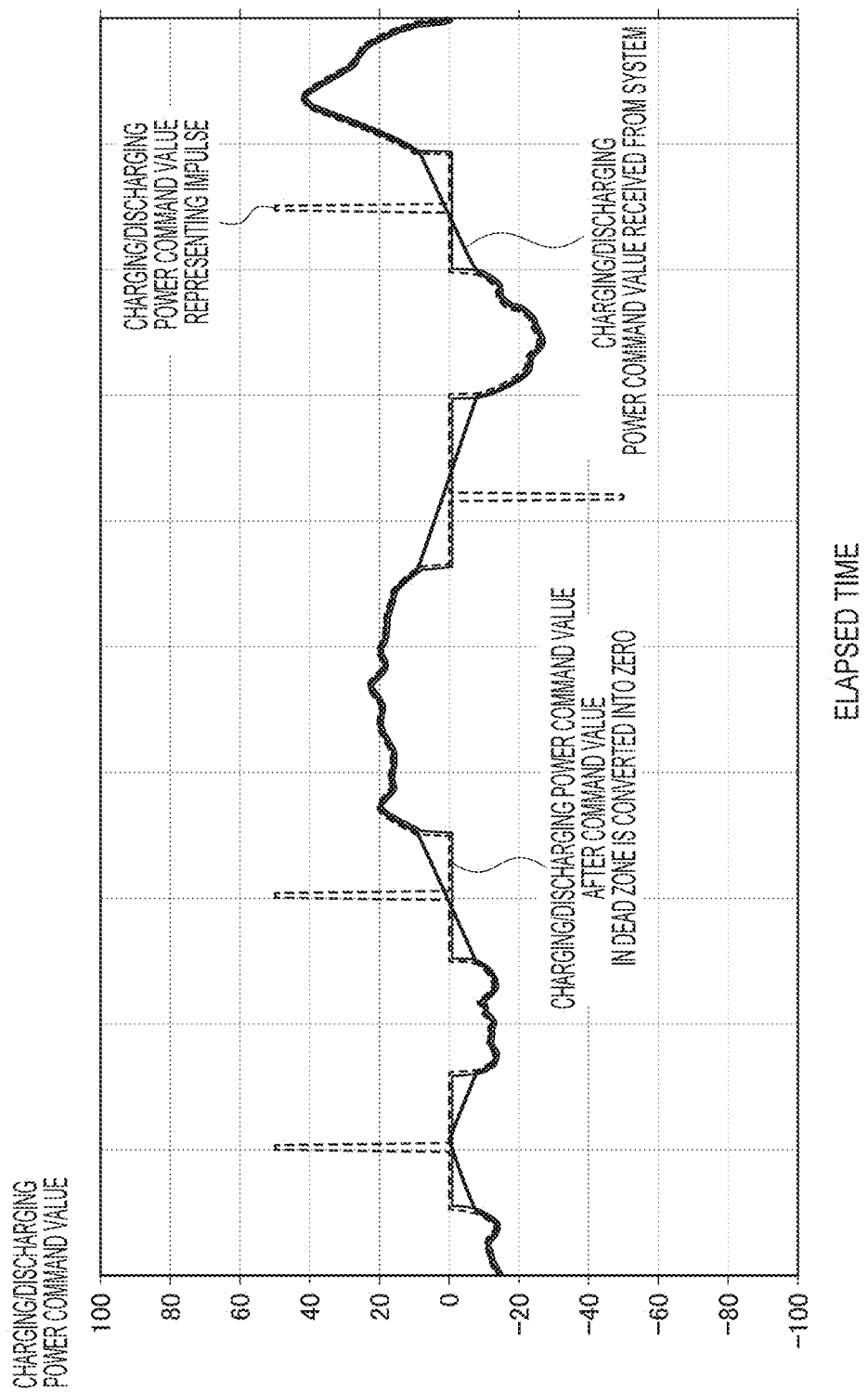
FIG. 20 is a diagram for explaining an impulse.

In the embodiment explained above, the deterioration state is evaluated using the response characteristic of the voltage at the time of the entry into the dead zone. As another method, it is also possible to apply impulse to the energy storage device in the dead zone and evaluate the deterioration state using a response characteristic of the energy storage device. That is, the charging/discharging controller 111 generates a charging/discharging power command value representing the impulse in the dead zone and outputs the charging/discharging power command value to the AC/DC conversion machine 112 and the state evaluator 114 (e.g., converts the charging/discharging power command value into a value representing the impulse rather than converting the charging/discharging power command value into zero). The AC/DC conversion machine 112 executes the charging/discharging power command value, whereby the impulse is applied to the energy storage device in the dead zone. In FIG. 20, an example is shown in which the charging/discharging power command value representing the value of the impulse is set in the dead zone is shown. During the impulse application, it is desirable that a response of the voltage does not remain or remains little at the time of the entry into the dead zone. Therefore, the impulse may be applied after a fixed time from the entry into the dead zone or after a fixed sample. In the example shown in the figure, the charging/discharging power command value superimposed with the impulse is generated at timing when the charging/discharging power command value received from the SCADA is accidentally 0. However, the evaluation of the deterioration state is not limited to this. It is possible to evaluate the deterioration state by executing the same processing as explained above regarding a point in time when the impulse ends as the time immediately before the entry into the dead zone.

Figure 21:
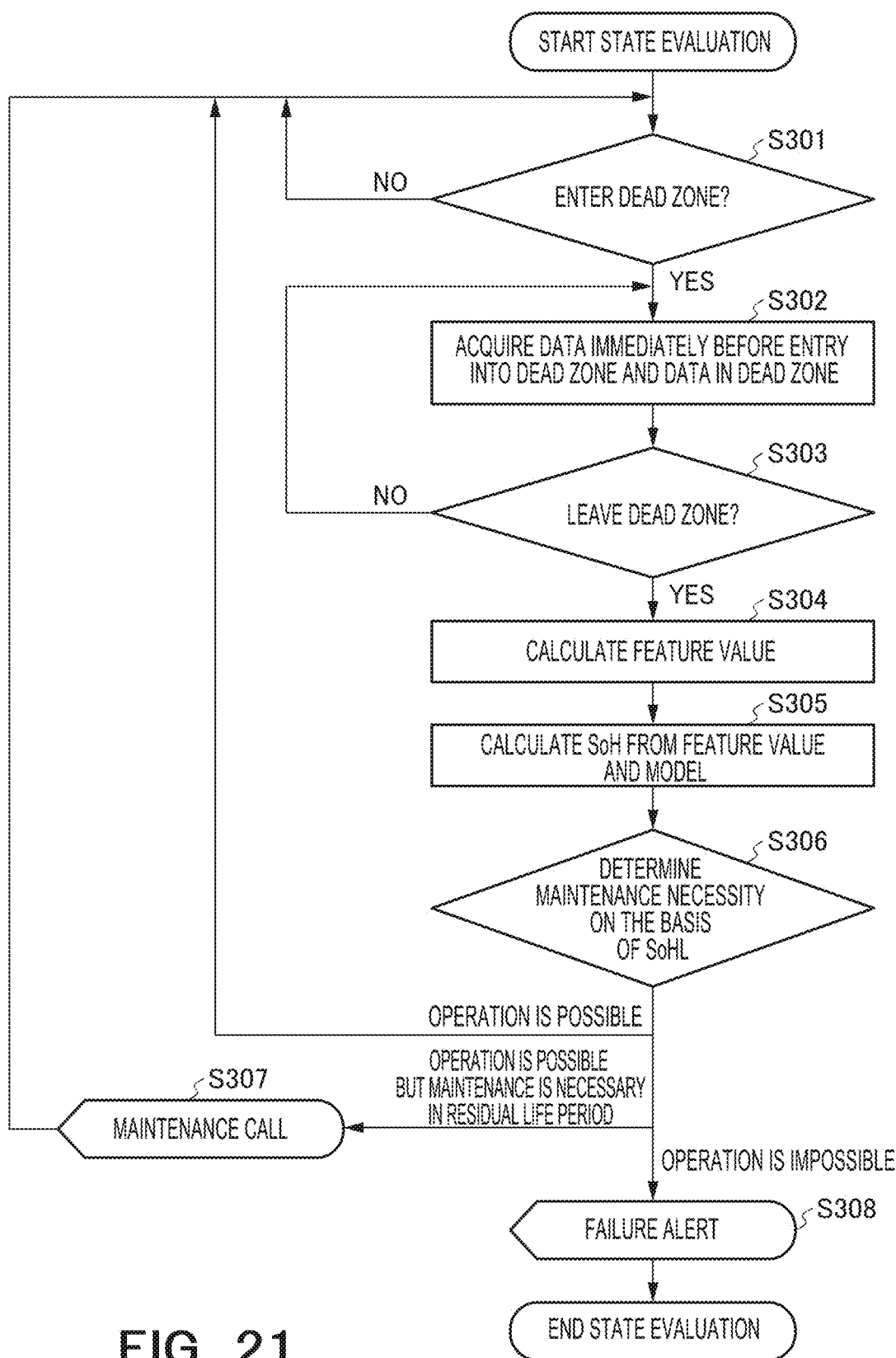
FIG. 21 is a flowchart of the operation of the energy storage system according to the embodiment of the present invention.

FIG. 21 is a flowchart of the operation of the energy storage system according to the embodiment of the present invention.

The energy storage system 101 starts deterioration state evaluation processing of the energy storage device at any timing. A charging/discharging power command value output by the charging/discharging controller 111 and battery information measured from the energy storage device are accumulated in the information storage 151. The command value determiner 152 monitors the charging/discharging power command value and determines whether the charging/discharging power command value enters the dead zone, that is, the charging/discharging power command value changes from a non-zero value to zero (S301). When the command value determiner 152 determines that the charging/discharging power command value enters the dead zone, the data generator 156 acquires data at time immediately before the entry into the dead zone and data at times in the dead zone from the information storage 151 and passes the data to the response evaluator 153 (S302). The data generator 156 repeats the acquisition of data at time not acquired yet in the dead zone until the command value determiner 152 determines that the charging/discharging power command value leaves the dead zone (S303). Note that, in this flowchart, the processing is performed on a real-time basis. However, it is also possible to cause the information storage 151 to store battery information and a charging/discharging command value and perform the processing as batch processing.

The response evaluator 153 calculates a feature value using the data at times in the dead zone and the data immediately before the entry into the dead zone (S304). As the feature value, an average of instantaneous voltages or a slope of the intercept B can be used. Alternatively, a value of the intercept B, a value of an instantaneous voltage, instantaneous resistance, relaxed resistance, or the like can also be used. The feature value may be a feature value other than the values explained above.

The SoH calculator 159 reads out a model corresponding to the feature value calculated in the response evaluator 153 from the model storage 154. The SoH calculator 159 specifies a deterioration state (a SoH) corresponding to the feature value in the read-out model (S305).

The maintenance scheduler 160 determines an operation state of the energy storage device on the basis of a value of the SoH (S306). If the energy storage device is in an operable state, the processing returns to step 301. Alternatively, when a predetermined end condition is satisfied, for example, when an end instruction is given from the administrator, the processing may be ended. When determining that the operation state is the operable state but maintenance is necessary within a residual life period of the storage battery, the maintenance scheduler 160 may transmit a message of maintenance call to the ESS monitoring system 301 (S307). The processing returns to step 301. When the operation state is an inoperable state, the maintenance scheduler 160 transmits a message of a failure alert to the ESS monitoring system 301 (S308). The processing is ended.

According to the embodiment of the present invention, in the energy storage system 101 (the ESS) in which an electric current (a charging/discharging current) input to and output from the power system 401 continuously changes, it is possible to evaluate a battery state of the energy storage system 101 while operating a function of the ESS such as frequency fluctuation suppression of the power system 401 (without stopping the energy storage system 101).

Figure 22:
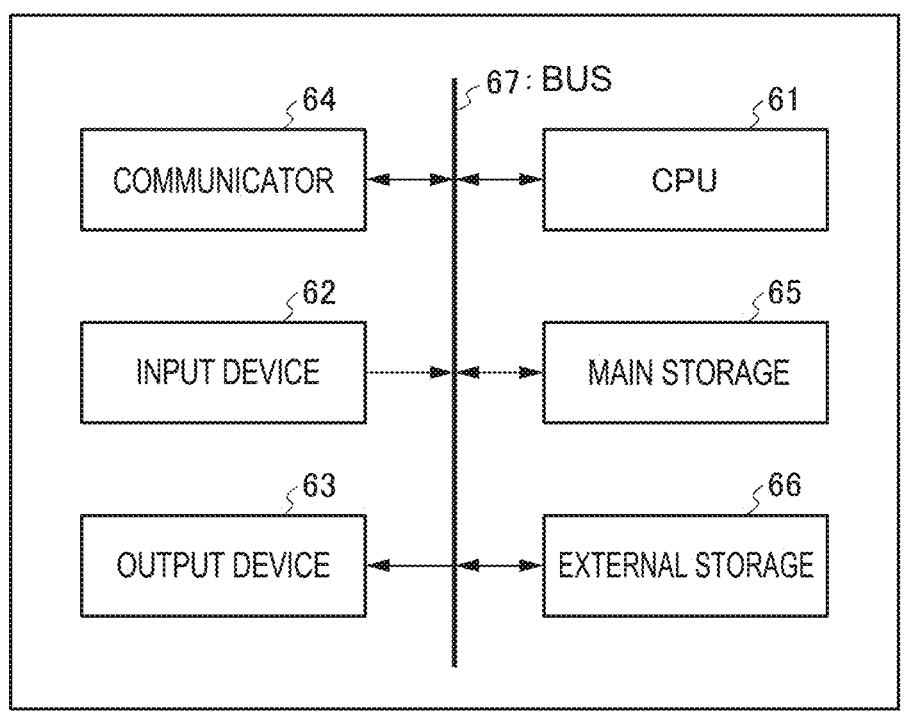
FIG. 22 is a diagram showing a hardware configuration example according to the embodiment of the present invention.

In FIG. 22, a hardware configuration example of the state evaluator 114 and the charging/discharging controller 111 in the energy storage system according to the embodiment of the present invention is shown. The hardware configuration shown in FIG. 22 includes a CPU 61, an input device 62, an output device 63, a communicator 64, a main storage 65, and an external storage 66, which are communicably connected to one another by a bus 67.

The input device 62 acquires battery information measured in the storage battery 113 via a wire or the like. The output device 63 outputs a charging/discharging command to the AC/DC conversion machine 112. The communicator 64 includes wireless or wired communication means and performs communication with the SCADA 201 and the ESS monitoring system 301 respectively in predetermined communication schemes. The input device 62, the output device 63, and the communicator 64 may be respectively configured by separate circuits such as integrated circuits or may be configured by a single circuit such as an integrated circuit.

The external storage 66 includes storage media such as a HDD, a SSD, a memory device, a CD-R, a CD-RW, a DVD-RAM, and a DVD-R. The external storage 66 has stored therein computer programs for causing the CPU 61, which is a processor, to execute the functions of the state evaluator and the charging/discharging controller. The information storage 151 and the model storage 154 are also included in the external storage 66. Only one external storage 66 is shown: however, a plurality of external storages 66 may be present.

The main storage 65 expands a control program stored in the external storage 66 under the control by the CPU 61 and stores data necessary during the execution of the program, data generated by the execution of the program, and the like. The main storage 65 includes any memory or storage such as a volatile memory (a DRAM, a SRAM, etc.) or a nonvolatile memory (a NAND flash memory, a MRAM, etc.). The control program expanded in the main storage 65 is executed by the CPU 61, whereby the functions of the state evaluator 114 and the charging/discharging controller 111 are executed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. An information processing apparatus comprising:
a charging/discharging controller configured to acquire a charging/discharging power command value, perform control to charge or discharge an energy storage device according to the charging/discharging power command value, set a dead zone in which an absolute value of the charging/discharging power command value is equal to or smaller than a threshold, and perform control to stop the charging or discharging when the charging/discharging power command value enters the dead zone; and
an evaluator configured to measure a response characteristic of a voltage of the energy storage device at a time when the charging or discharging is stopped by the charging and discharging power command value entering the dead zone, and evaluate a state of the energy storage device on a basis of the response characteristic.

2. The information processing apparatus according to claim 1, wherein the evaluator evaluates the state of the energy storage device on the basis of response characteristics of voltages of ohmic resistance and reaction resistance of the energy storage device.

3. The information processing apparatus according to claim 2, wherein the response characteristics of the voltages include amount of the fluctuation of the voltages of the ohmic resistance and the reaction resistance.

4. The information processing apparatus according to claim 1, wherein the evaluator evaluates the state of the energy storage device on the basis of a response characteristic of a voltage of diffused resistance of the energy storage device.

5. The information processing apparatus according to claim 4, wherein the response characteristic of the voltage includes a value of an intercept of an equation representing the response characteristic of the voltage of the diffused resistance.

6. The information processing apparatus according to claim 1, wherein
the charging/discharging controller performs control to apply impulse to the energy storage device while the charging or discharging of the energy storage device is stopped, and
the evaluator evaluates the state of the energy storage device by measuring a response of a voltage due to the application of the impulse.

7. The information processing apparatus according to claim 1, further comprising a setter configured to set the threshold, wherein
the charging/discharging controller uses the threshold set by the setter.

8. The information processing apparatus according to claim 1, wherein the energy storage device is a cell, a module in which a plurality of the cells are connected in series, in parallel, or in series and in parallel, a battery board in which a plurality of the modules are connected in series, in parallel, or in series and in parallel, or a battery array in which a plurality of the battery boards are connected in series, in parallel, or in series and in parallel.

9. The information processing apparatus according to claim 1, wherein the state of the energy storage device is a deterioration state of the energy storage device.

10. An energy storage system comprising:
an energy storage device; and
a charging/discharging controller configured to acquire a charging/discharging power command value, perform control to charge or discharge the energy storage device according to the charging/discharging power command value, set a dead zone in which the charging or discharging is not performed when an absolute value of the charging/discharging power command value is equal to or smaller than a threshold, and perform control to stop the charging or discharging when the charging/discharging power command value enters the dead zone; and
an evaluator configured to measure a response characteristic of a voltage of the energy storage device at a time when the charging or discharging is stopped by the charging and discharging power command value entering the dead zone, and evaluate a state of the energy storage device on a basis of the response characteristic.

11. A information processing method comprising:
acquiring a charging/discharging power command value;
performing control to charge or discharge an energy storage device according to the charging/discharging power command value;

setting a dead zone in which the charging or discharging is not performed when an absolute value of the charging/discharging power command value is equal to or smaller than a threshold;

performing control to stop the charging or discharging when the charging/discharging power command value enters the dead zone;

measuring a response characteristic of a voltage of the energy storage device at a time when the charging or discharging is stopped by the charging and discharging power command value entering the dead zone; and evaluating a state of the energy storage device on a basis of the response characteristic.

* * * * *